(12) United States Patent
Rombach et al.

(10) Patent No.: US 11,746,001 B2
(45) Date of Patent: Sep. 5, 2023

(54) MICROELECTROMECHANICAL MICROPHONE WITH MEMBRANE TRENCH REINFORCEMENTS AND METHOD OF FABRICATION

(71) Applicants: TDK Electronics AG, Munich (DE); TDK Corporation, Tokyo (JP)

(72) Inventors: Pirmin Hermann Otto Rombach, Kongens Lyngby (DK); Kurt Rasmussen, Herlev (DK); Dennis Mortensen, Bagsvard (DK); Cheng-Yen Liu, Søborg (DK); Morten Ginnerup, Kongens Lyngby (DK); Jan Tue Ravnkilde, Hedehusene (DK); Jotaro Akiyama, Tokyo (JP)

(73) Assignees: TDK Electronics AG, Munich (DE); TDK Corporation, Tokyo (JP)

( * ) Notice: Subject to any disclaimer, the term of this patent is extended or adjusted under 35 U.S.C. 154(b) by 116 days.

(21) Appl. No.: 17/308,340

(22) Filed: May 5, 2021

(65) Prior Publication Data
US 2021/0347635 A1 Nov. 11, 2021

Related U.S. Application Data

(60) Provisional application No. 63/066,652, filed on Aug. 17, 2020, provisional application No. 63/020,216, filed on May 5, 2020.

(51) Int. Cl.
*B81B 3/00* (2006.01)
*B81C 1/00* (2006.01)
*H04R 1/08* (2006.01)

(52) U.S. Cl.
CPC ........ *B81B 3/0051* (2013.01); *B81C 1/00158* (2013.01); *H04R 1/08* (2013.01);
(Continued)

(58) Field of Classification Search
CPC .......... B81B 3/0051; B81B 2201/0257; B81B 2203/0127; H04R 1/08; H04R 2201/003;
(Continued)

(56) References Cited

U.S. PATENT DOCUMENTS 9,462,389 B2 * 10/2016 Wang ...................... H04R 7/16
10,250,998 B2 * 4/2019 Hsieh ..................... B81B 3/007
(Continued)

FOREIGN PATENT DOCUMENTS

WO 2014159552 A1 10/2014

*Primary Examiner* — Sean H Nguyen
(74) *Attorney, Agent, or Firm* — Slater Matsil, LLP

(57) ABSTRACT

A microelectromechanical (MEMS) microphone with membrane trench reinforcements and method of fabrication is provided. The MEMS microphone includes a flexible plate and a rigid plate mechanically coupled to the flexible plate. The MEMS microphone includes a stoppage member affixed to the rigid plate and extending perpendicular relative to a surface of the rigid plate opposite the surface of the flexible plate. The stoppage member limits motion of the flexible plate. The rigid plate includes a reverse bending edge that include a first lateral etch stop that includes a first corner radius and a second lateral etch stop that includes a second corner radius. The first corner radius is more than 100 nanometers and the second corner radius is more than 25 nanometers. Further, a lateral step width between the first corner radius and the second corner radius is less than around 4 micrometers.

18 Claims, 24 Drawing Sheets

(52) U.S. Cl.
CPC .......... *B81B 2201/0257* (2013.01); *B81B 2203/0127* (2013.01); *B81C 2201/053* (2013.01); *B81C 2201/056* (2013.01); *H04R 2201/003* (2013.01)

(58) Field of Classification Search
CPC ...... H04R 31/003; H04R 31/00; H04R 19/04; H04R 19/005; B81C 1/00158; B81C 2201/053; B81C 2201/056
USPC .......................................................... 381/369
See application file for complete search history.

(56) References Cited

U.S. PATENT DOCUMENTS

| | | | |
|---|---|---|---|
| 10,327,077 B2* | 6/2019 | Yoo | H04R 19/04 |
| 11,388,496 B2* | 7/2022 | Rombach | H04R 1/08 |
| 2010/0065930 A1* | 3/2010 | Nakatani | H01L 28/40 |
| | | | 257/629 |
| 2011/0278683 A1* | 11/2011 | Kasai | H04R 19/005 |
| | | | 257/416 |
| 2015/0041930 A1* | 2/2015 | Kim | H04R 31/00 |
| | | | 257/416 |
| 2015/0358735 A1* | 12/2015 | Klein | H04R 7/02 |
| | | | 257/419 |
| 2018/0208455 A1* | 7/2018 | Wang | B81B 3/001 |
| 2019/0124452 A1 | 4/2019 | Hsieh et al. | |
| 2020/0196065 A1* | 6/2020 | Pedersen | H04R 19/005 |
| 2020/0290864 A1* | 9/2020 | Fueldner | H04R 19/005 |

* cited by examiner

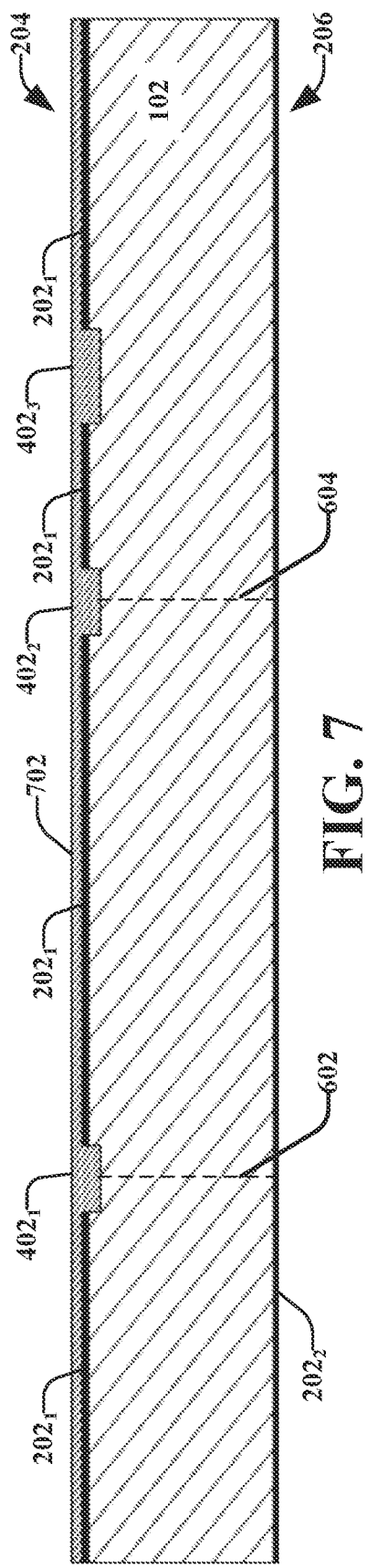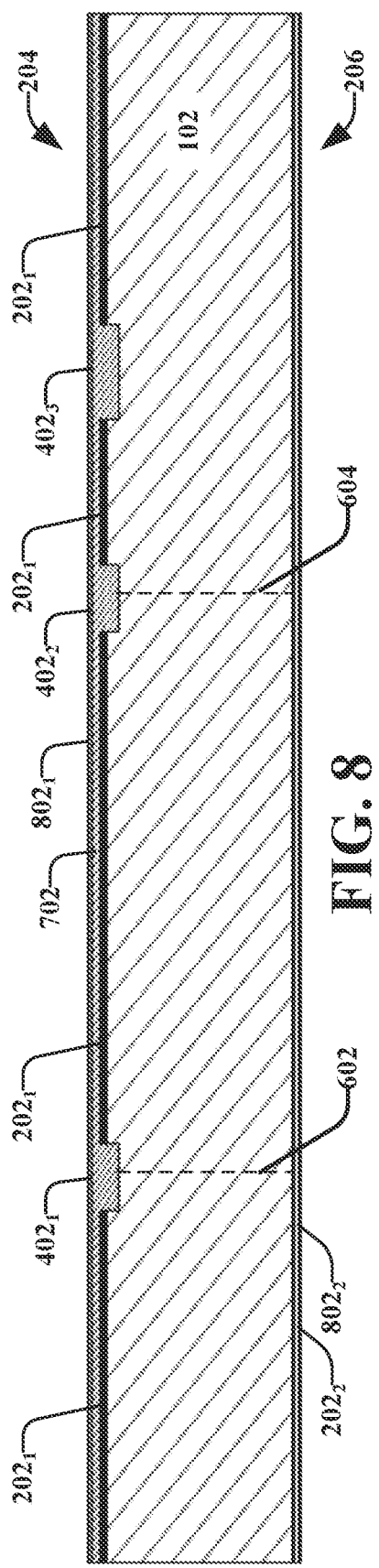
FIG. 7
FIG. 8

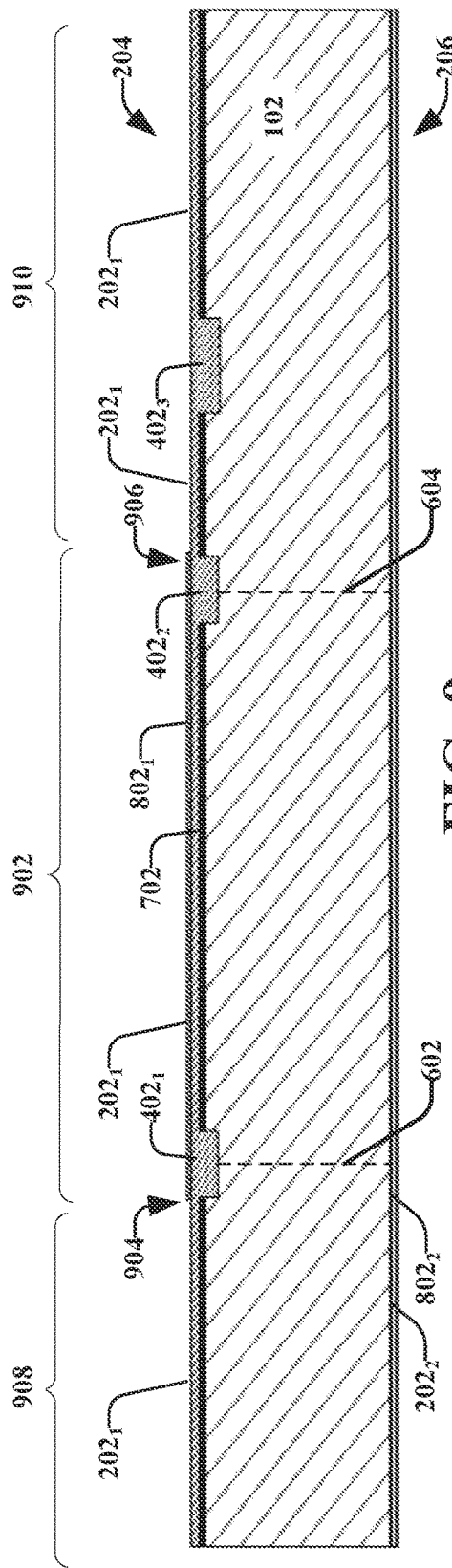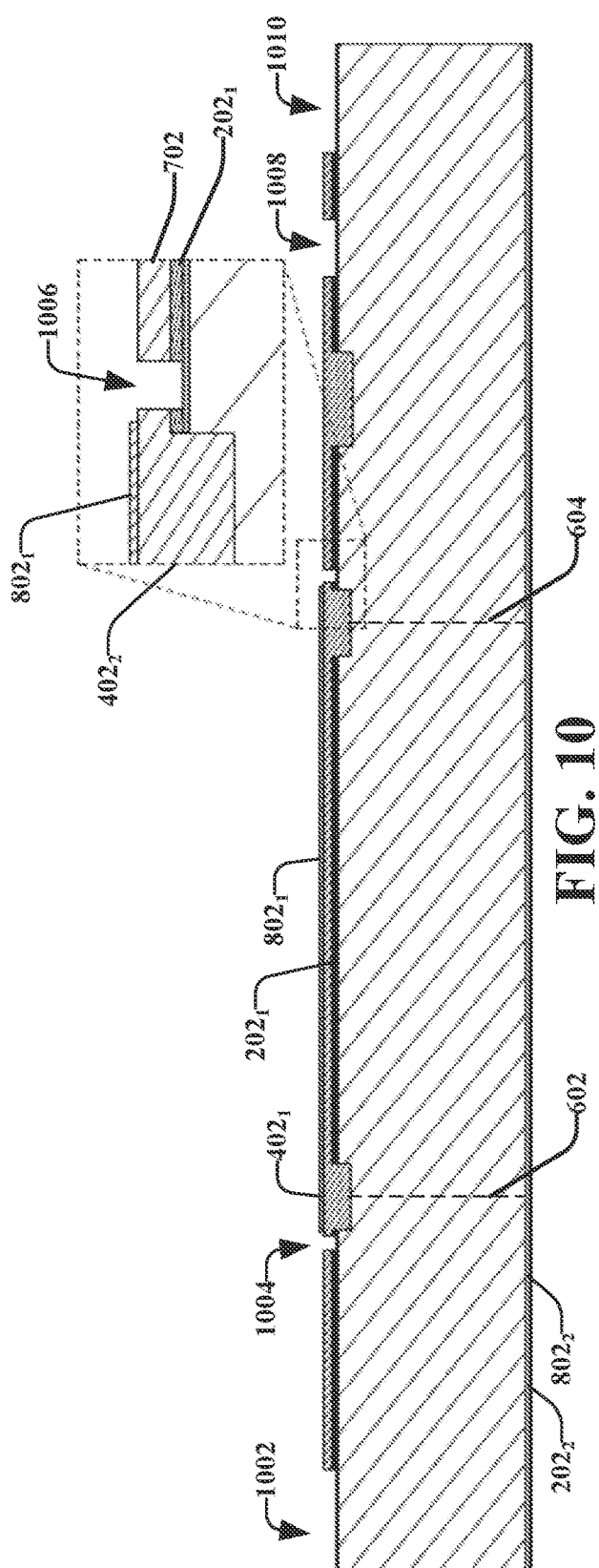
FIG. 9
FIG. 10

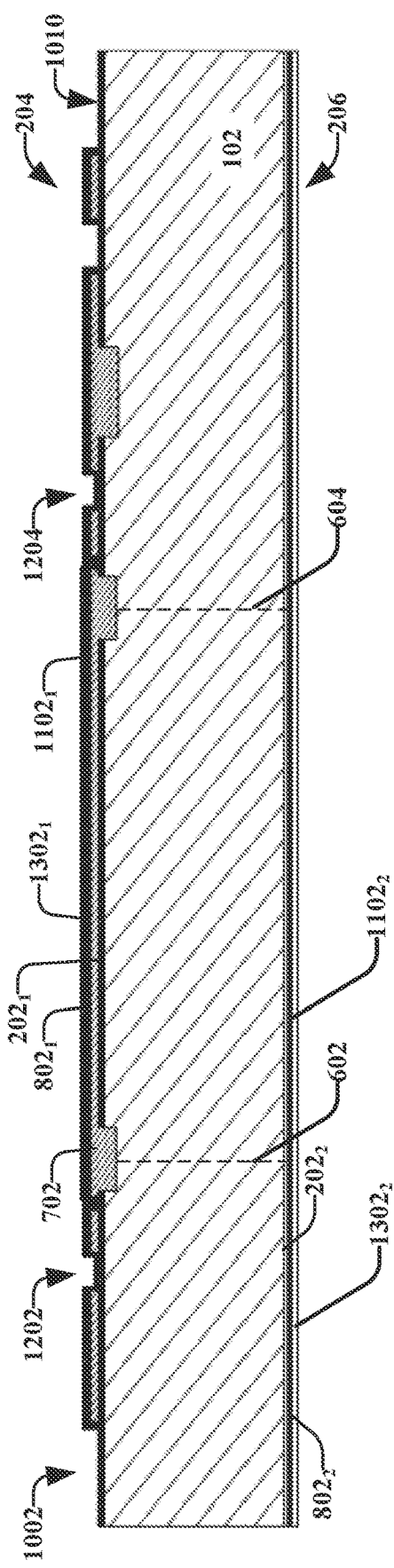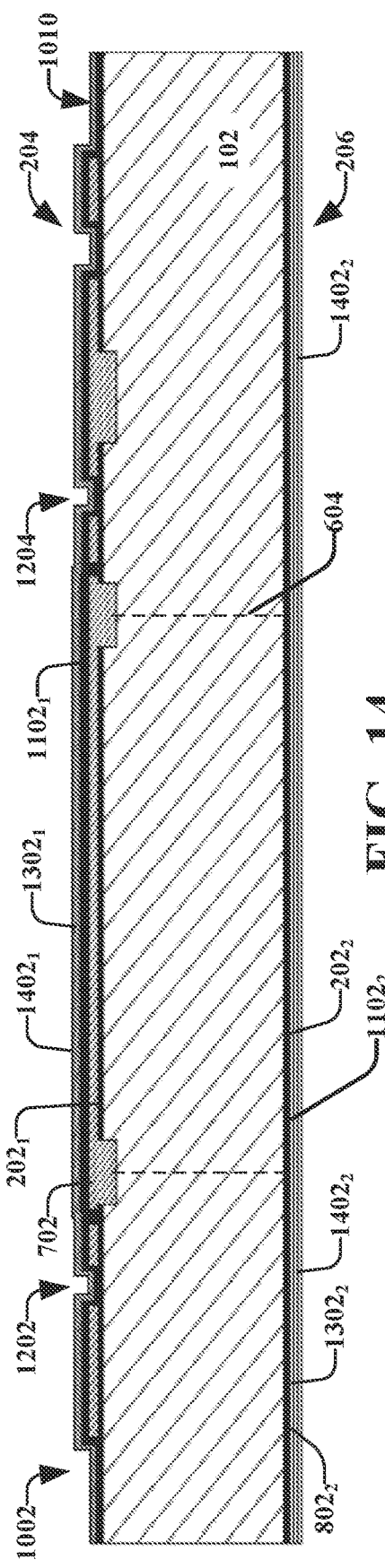
FIG. 13
FIG. 14

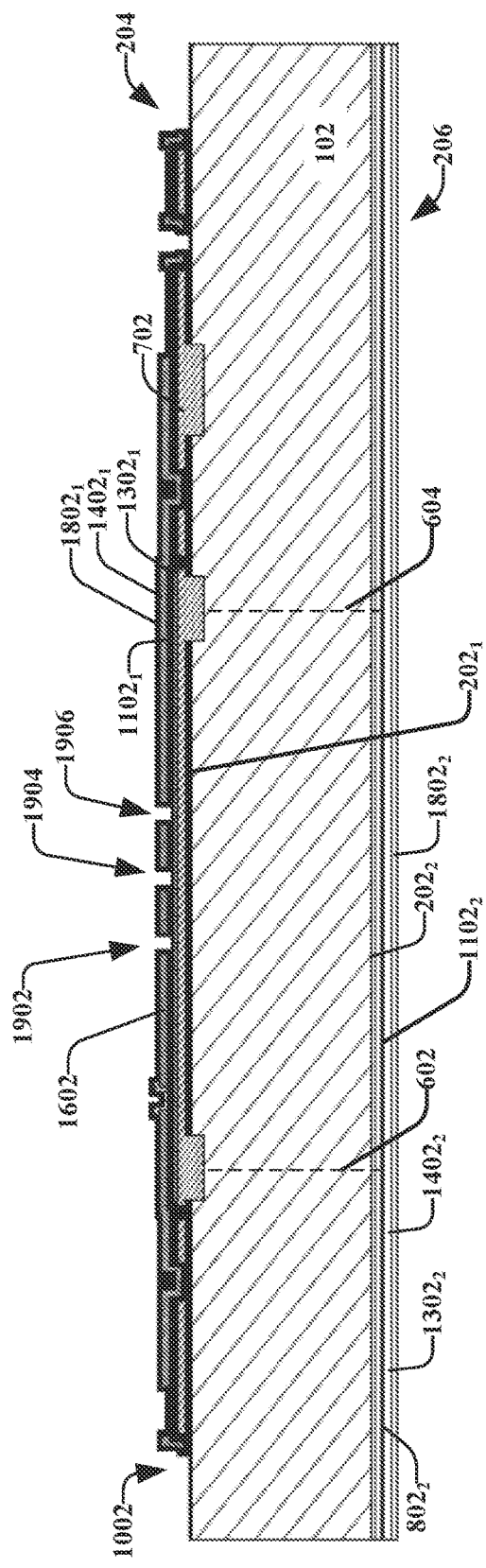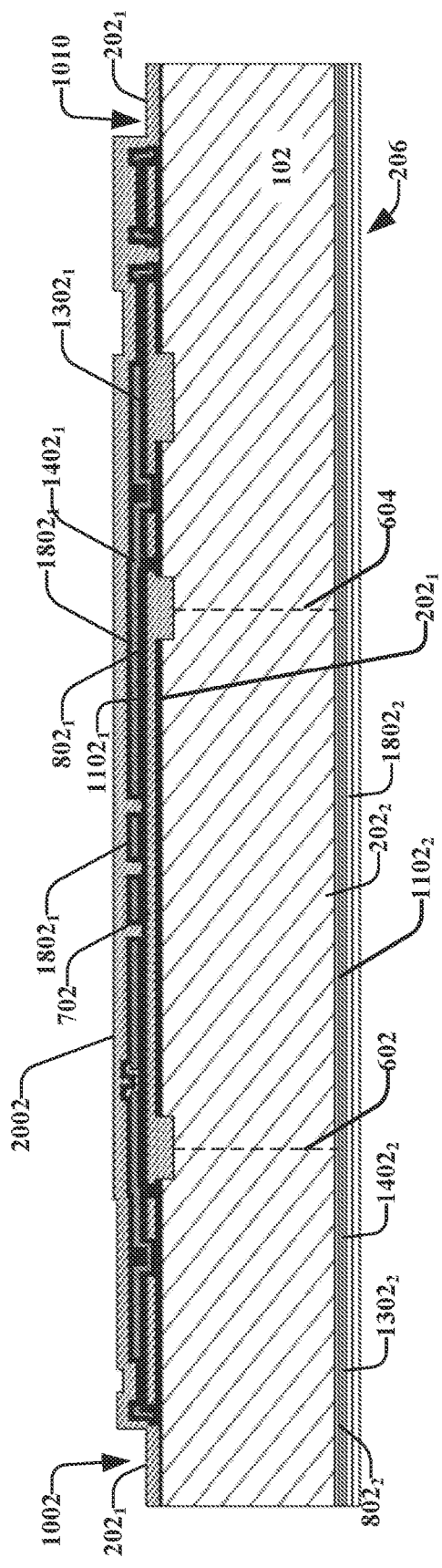
FIG. 19
FIG. 20

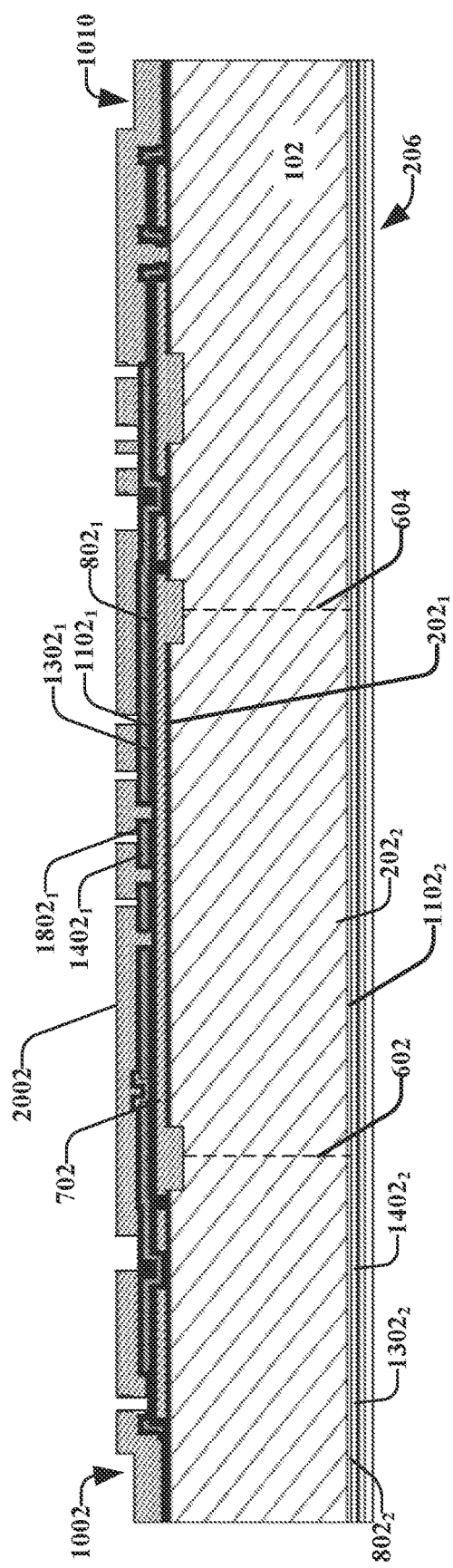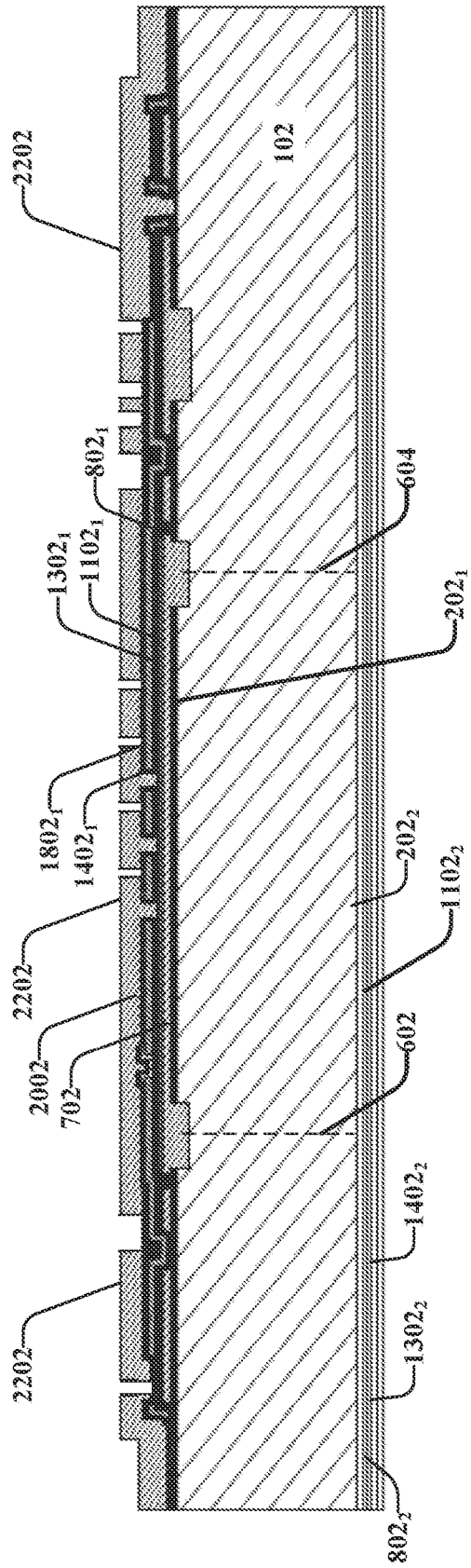

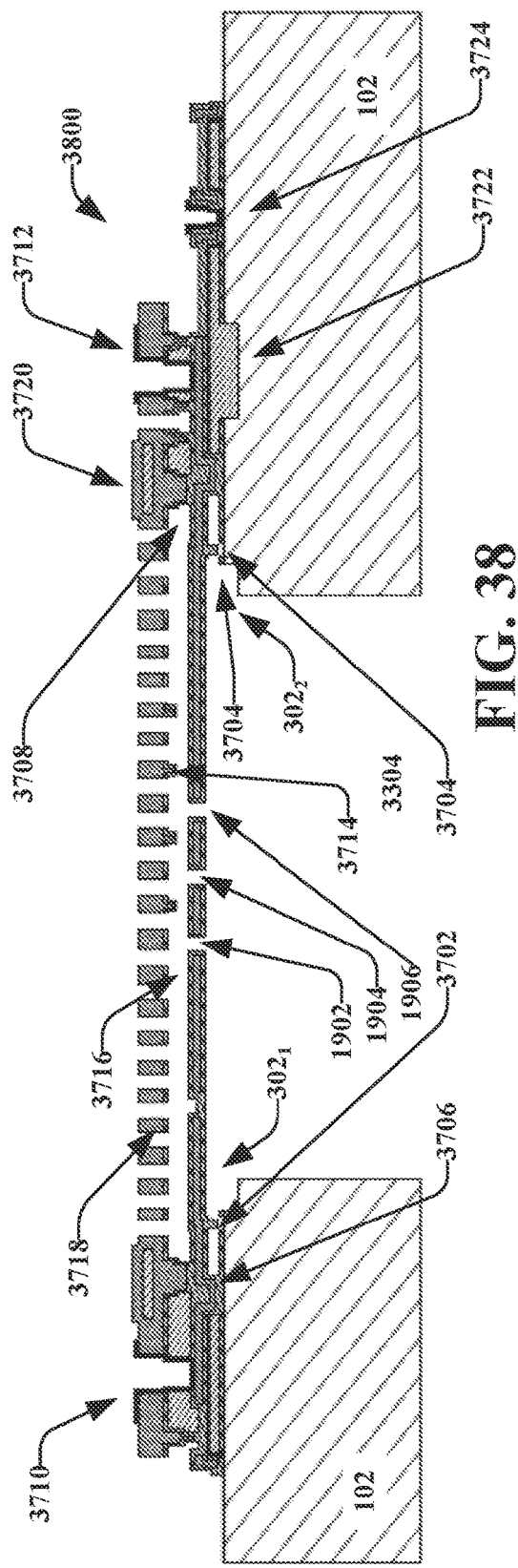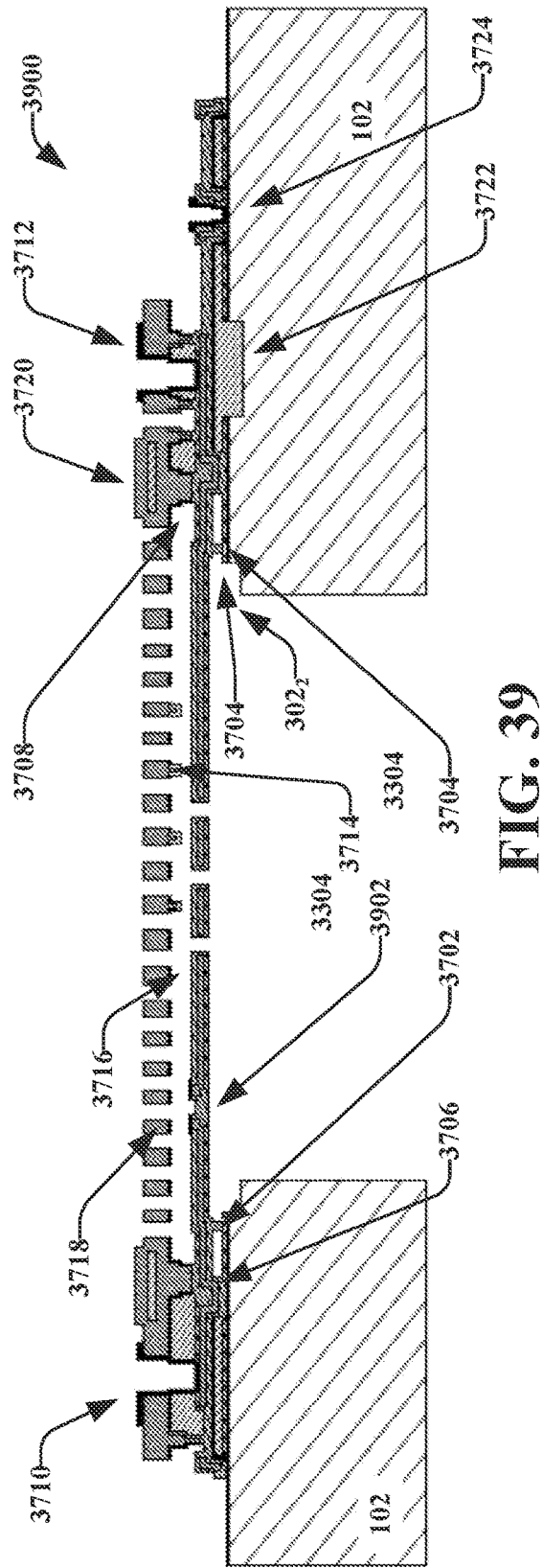

MICROELECTROMECHANICAL MICROPHONE WITH MEMBRANE TRENCH REINFORCEMENTS AND METHOD OF FABRICATION

CROSS REFERENCE TO RELATED APPLICATIONS

This application claims the benefit of and priority to U.S. Provisional Application No. 63/020,216, filed May 5, 2020, entitled "PROCESS FLOW FOR MEMS MICROPHONE," and U.S. Provisional Application No. 63/066,652, filed Aug. 17, 2020, entitled "PROCESS FLOW FOR MEMS MICROPHONE." The content of the above applications are hereby expressly incorporated by reference herein in their entireties.

BACKGROUND

Micro-Electro-Mechanical Systems (MEMS) is a class of structures and/or devices that are fabricated using semiconductor-like processes. MEMS structures and/or devices exhibit mechanical characteristics that include the ability to move or to deform. Examples of MEMS devices include, but are not limited to, gyroscopes, accelerometers, magnetometers, pressure sensors, radio-frequency components, and so on. Silicon wafers that include MEMS structures are referred to as MEMS wafers. Unique challenges exist to provide MEMS devices and/or structures with improved performance and reliability.

BRIEF DESCRIPTION OF THE DRAWINGS

Various non-limiting embodiments are further described with reference to the accompanying drawings in which:

FIGS. 1-36 illustrate example, non-limiting, cross-sectional views of a MEMS microphone undergoing a fabrication process in accordance with one or more embodiments described herein;

FIG. 38 illustrates a further example representation of a MEMS microphone according to one or more embodiments described herein; and FIG. 39 illustrates another example representation of a MEMS microphone according to one or more embodiments described herein.

DETAILED DESCRIPTION

One or more embodiments are now described more fully hereinafter with reference to the accompanying drawings in which example embodiments are shown. In the following description, for purposes of explanation, numerous specific details are set forth in order to provide a thorough understanding of the various embodiments.

FIGS. 1-36 illustrate example, non-limiting, cross-sectional views of a MEMS microphone undergoing a fabrication process in accordance with one or more embodiments described herein.

Figure 1:
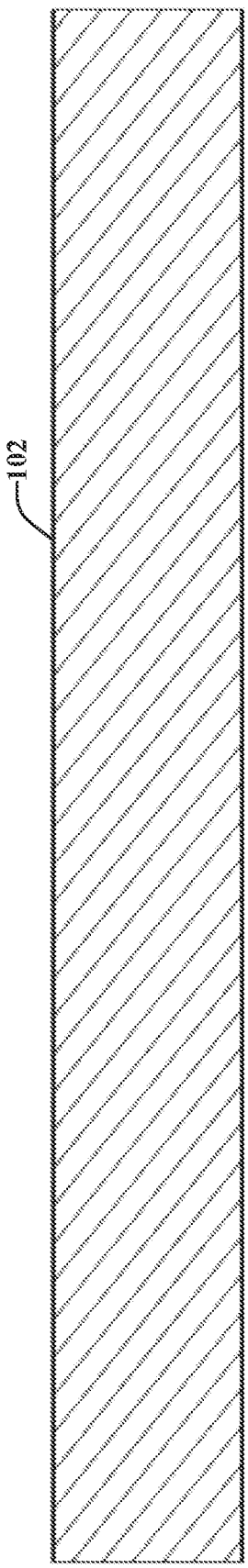

FIG. 1 illustrates a cross-sectional view of a first stage of formation of a MEMS microphone in accordance with one or more embodiments described herein. At the first stage, a wafer 102 (e.g., a wafer substrate) can undergo ion implantation. The substrate can comprise aluminum copper or silicon, for example. According to an implementation, the ion implantation of the wafer 102 can be a phosphorus ion-implantation. Additionally, the ion implantation can be a process module bulk doping.

Figure 2:
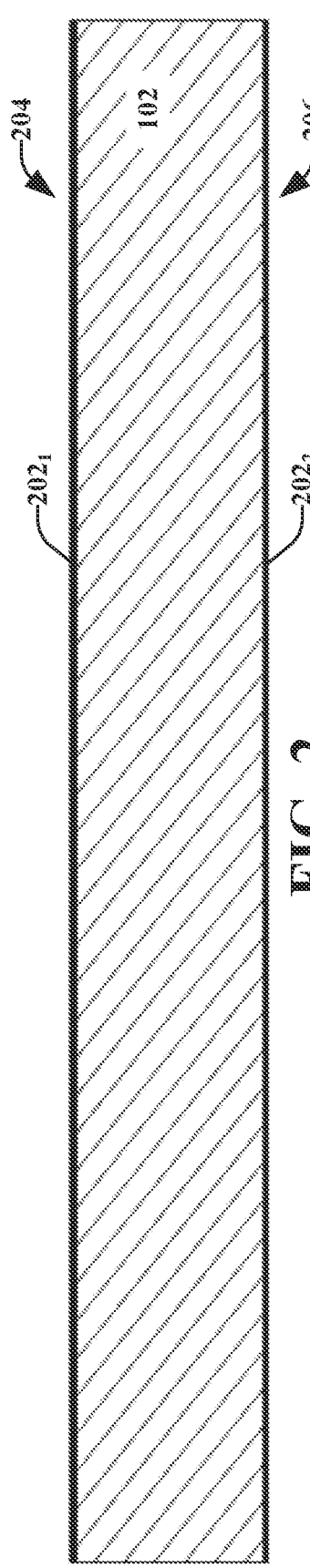

As indicated at FIG. 2, a low-stress silicon nitride thin film (LSN thin film) can be deposited on the wafer 102. More specifically, a first LSN thin film $202_1$ can be deposited on a first surface (e.g., a first side 204) of the wafer 102 and a second LSN thin film $202_2$ can be deposited on a second surface (e.g., a second side 206) of the wafer 102. As illustrated, the first side 204 and the second side 206 are on opposite sides of the wafer 102.

Figure 3:
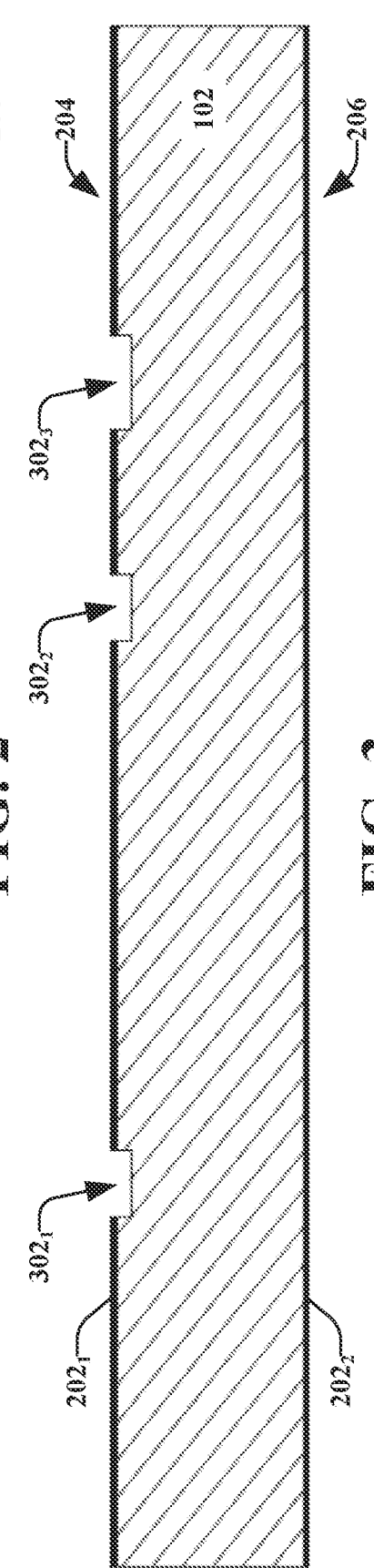

One or more cavities can be etched on the first side 204, through the first LSN thin film $202_1$ and into the wafer 102, as indicated at FIG. 3. For example, illustrated are three cavities, labeled as a first cavity $302_1$, a second cavity $302_2$, and a third cavity $302_3$. A cavity refers to an opening or recession in a substrate layer (e.g., the wafer 102). In the example illustrated, there are three cavities, however, another number of cavities (e.g., one or more) can be formed in the wafer 102 according to various implementations. The one or more cavities can be etched via a Deep Reactive-Ion Etching (DRIE) process. In some implementations, a first mask (M1) can be utilized to etch the one or more cavities.

According to some implementations, etching the first cavity $302_1$ and the second cavity $302_2$ can be referred to as a front cavity etch. Further to these implementations, the first cavity $302_1$ can be referred to as a first front cavity and the second cavity $302_2$ can be referred to as a second front cavity, or collectively as front cavities.

According to some implementations, the one or more cavities can be around 4 micrometers (4 μm) donut ring that can absorb DRIE position inaccuracy. Further, the one or more cavities can define a distance to a membrane stopper and a lateral etch stop 1 (LES 1), which will be discussed in further detail below.

Figure 4:
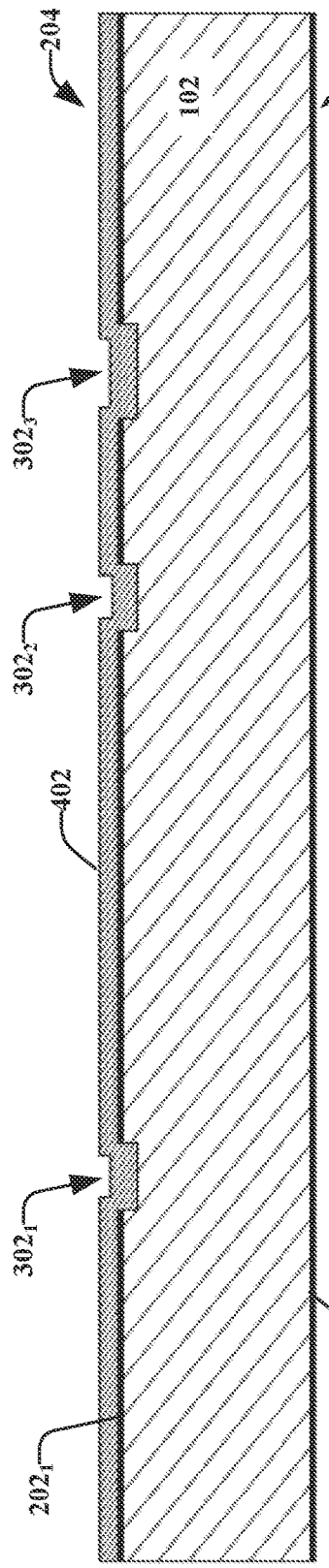

FIG. 4 illustrates a stage of the fabrication process that includes depositing a first oxide layer. Depositing the first oxide layer can include filling the one or more cavities by performing oxide deposition, according to an embodiment. As indicated, a first oxide layer 402 is deposited on the first side 204 of the wafer 102. The first oxide layer 402 is deposited over the first LSN thin film $202_1$. Further, the first oxide layer 402 can be deposited within the one or more cavities (e.g., the first cavity $302_1$, the second cavity $302_2$, and the third cavity $302_3$). As indicated, the first oxide layer 402 that is deposited within the one or more cavities is deposited over portions of the wafer 102 exposed by the one or more cavities. Further, the first oxide layer 402 is deposited on respective sides of the one or more cavities, adjacent the wafer 102 and adjacent the first LSN thin film $202_1$. The first oxide layer 402 can comprise, for example, tetraethyl orthosilicate (TEOS), also referred to as tetraethoxysilane.

Figure 5:
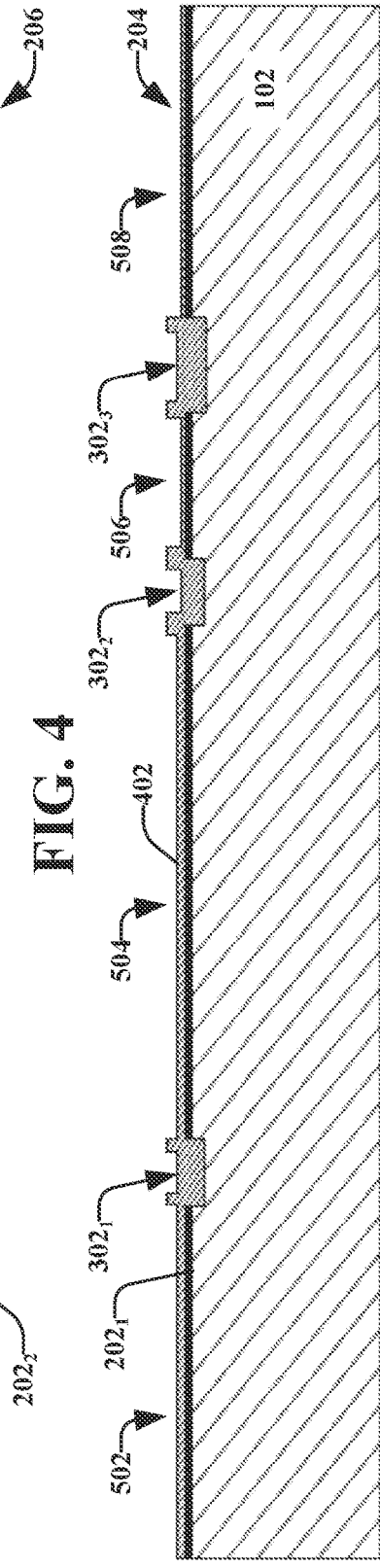

Reverse etch of the filling oxide (e.g., the first oxide layer 402) can be performed at a next stage of the fabrication process, as illustrated in FIG. 5. The reverse etch can facilitate etching of the first oxide layer 402 at one or more portions of the first oxide layer 402 that are not located at the areas associated with the one or more cavities (e.g., the first cavity $302_1$, the second cavity $302_2$, and the third cavity $302_3$). Example one or more portions of the first oxide layer 402 that can be etched are indicated at first portion 502, second portion 504, third portion 506, and fourth portion 508. The first portion 502 represents the portion between the left edge of the device (e.g., left edge when looking at FIG. 5) and the first cavity $302_1$. The second portion 504 represents the portion between the first cavity $302_1$ and the second cavity $302_2$. The third portion 506 represents the portion between the second cavity 302₂ and the third cavity 302₃. The fourth portion 508 represents the portion between the third cavity 302₃ and the right edge of the device (e.g., right edge when looking at FIG. 5).

Figure 6:
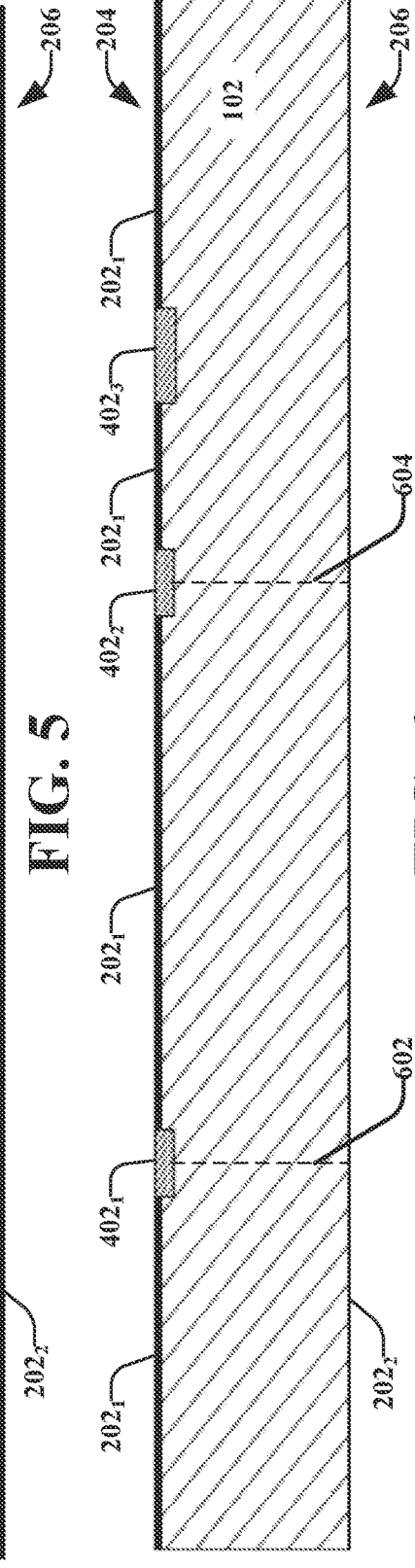

The reverse etch can include removing the filling oxide (e.g., the first oxide layer 402) via Reactive-Ion Etching (RIE) prior to performing a CMP process, as indicated in FIG. 6. Upon or after the CMP process, one or more portions of the first oxide layer 402 remain at the areas corresponding to the one or more cavities (e.g., filled cavities), as indicated by first cavity filled with the first oxide layer 402₁, second cavity filled with the first oxide layer 402₂, and third cavity filled with the first oxide layer 402₃.

The respective centers of the front cavities are indicated by a first dashed line 602 for the first cavity 302₁ and a second dashed line 604 for the second cavity 302₂.

FIG. 7 illustrates deposition of base oxide 702 during a next stage of the fabrication process. The base oxide 702 can be deposited over the first LSN thin film 202₁, over the first cavity filled with the first oxide layer 402₁, over the second cavity filled with the first oxide layer 402₂, and over the third cavity filled with the first oxide layer 402₃. The base oxide 702 can comprise TEOS, for example.

It is noted that, the front cavities can reduce the capacitive coupling between the membrane and the backplane through the bulk. The front cavities also can reduce the signal loss. It is noted that the illustrated example includes one decoupling capacitor, however, other decoupling capacitors can be included at different locations.

FIG. 8 illustrates membrane protection layer (MPL) deposition. MPL 802₁ can be deposited over the base oxide 702 on the first side 204. Further, MPL 802₂ can be deposited over the second LSN thin film 202₂ on the second side 206.

The MPL 802₁ can be a polysilicon protection layer on the backside (e.g., the first side 204). A thickness of the MPL 802₁ can around 100 nm. In some implementations, the MPL 802₁ can be less than about 500 nm. Further, the MPL 802₁ can facilitate control of a ventilation hole dimension (e.g., mitigates degradation of the ventilation hole dimension), protecting the performance of the cutoff frequency.

The MPL 802₁ and/or the MPL 802₂ can protect the membrane LSN (e.g., the first LSN thin film 202₁, the second LSN thin film 202₂) against various fabrication processes including Buffered Oxide Etch (BOE), and high frequency or very High Frequency (vHF) experienced during various use case situations. It is noted that the MPL 802₁ and/or the MPL 802₂ is an intermediate layer(s) that will be removed later in the fabrication process.

Upon or after deposition of the MPL 802₁, structuring of the MPL 802₁ is performed, as indicated in FIG. 9. The structuring of the MPL 802₁ can include retaining a portion of the MPL 802₁ that is located over the first cavity 302₁, over the second cavity 302₂, and over the area between the first cavity 302₁ and the second cavity 302₂ (or over the first cavity filled with the first oxide layer 402₁ and the second cavity filled with the first oxide layer 402₂). The portion of the MPL 802₁ that is retained is indicated at portion 902. For example, the portion of the MPL 802₁ that is retained extends from about a first side 904 of the first cavity filled with the first oxide layer 402₁ to about a second side 906 of the second cavity filled with the first oxide layer 402₂. The other portions of the MPL 802₁ (indicated at portion 908 and portion 910) are removed during the structuring of the MPL 802₁. The remaining portion of the MPL 802₁ (indicated at portion 902) helps to protect against over-etching nitride of the membrane (which will be deposited later in the fabrication process).

According to some implementations, a width of the two front cavities from center to center (e.g., between the first dashed line 602 and the second dashed line 604) is about at least around 20 micron wide. The cavity etching from the backside is targeted at the respective centers of the front cavities (which will be discussed with respect to FIG. 33). Thus, slight variations, such as plus or minus half the width as tolerance on the cavity position during the etch can be tolerated, which can facilitate manufacturability of the fabrication process. Thus, some inaccuracy during the fabrication process and the alignment can be absorbed at the front cavities as provided herein. Otherwise, appropriate positioning of the cavities might not be achieved.

FIG. 10 illustrates structuring of a membrane stopper according to an embodiment. Structuring the membrane stopper can include etching the base oxide 702 at the portions that are not covered by the MPL 802₁, or the portions indicated at portion 908 and portion 910 (refer to FIG. 9). For example, at portion 908, a first area 1002 and a second area 1004 of the base oxide 702 can be removed. Further, at portion 910, a scribe line and the bulk contact to the right (as looking at FIG. 10) can be opened up, which can include etching or removal of the base oxide 702 at a third area 1006 (shown in the enlarged view), a fourth area 1008, and a fifth area 1010. The etching can be in the range of around 0.95 micron for the membrane stopper dimension. The etch should be controlled down to the nitride (e.g., the first LSN thin film 202₁) to provide a defined amount of material when entering the release process, which is performed near the end of the fabrication process, as will be discussed further below.

The membrane stopper can dimple towards the bulk (e.g., towards the wafer 102). Such removal of the base oxide 702 to create the membrane stopper can reduce stress in the LES1, or the suspension area.

Figure 11:
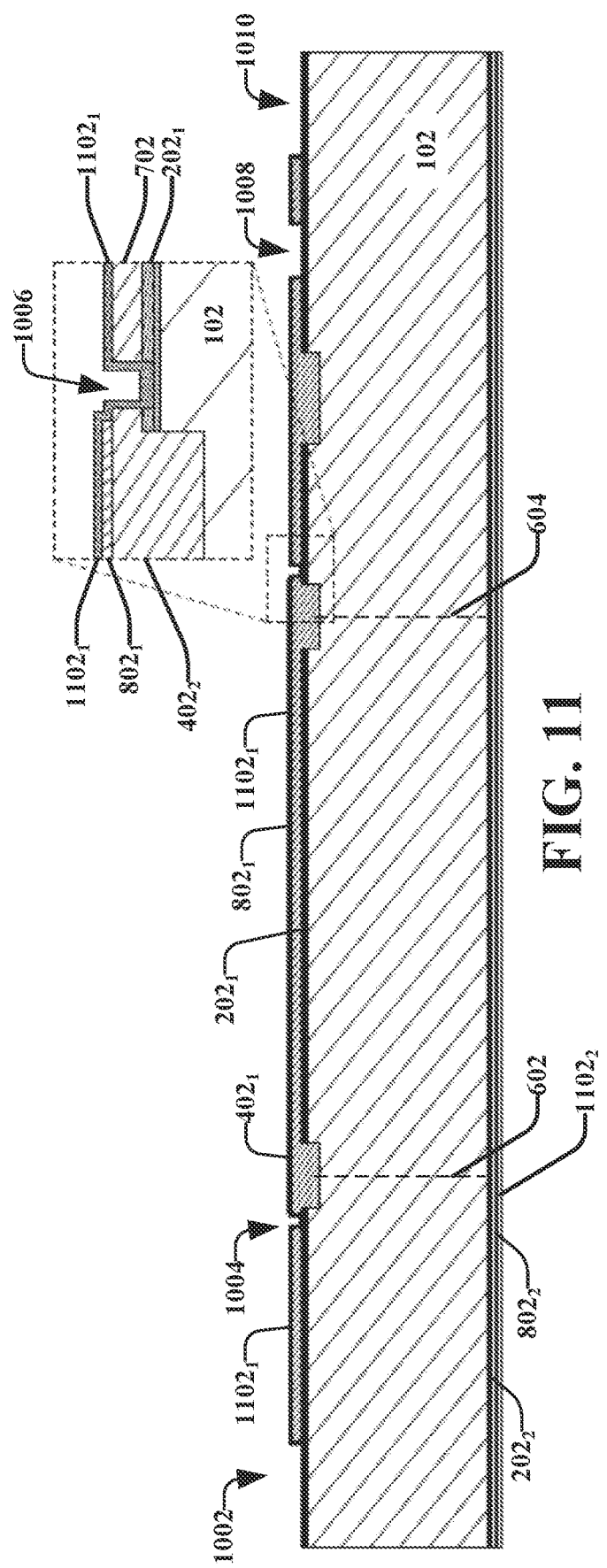

A second oxide layer can be deposited, as illustrated in FIG. 11. In some cases, the second oxide layer can be referred to as a membrane stopper spacer. For example, a portion of the second oxide layer (indicated by second oxide layer 1102₁) can be deposited over and adjacent the MPL 802₁. Further, the second oxide layer 1102₁ can be deposited over and adjacent the base oxide 702 and over the first LSN thin film 202₁. The second oxide layer 1102₁ can be deposited adjacent the MPL 802₁ at a first side of the MPL 802₁ located near the first side 904 of the first cavity filled with the first oxide layer 402₁ and a second side of the MPL 802₁ located near the second side 906 of the second cavity filled with the first oxide layer 402₂. The second oxide layer 1102₁ can be deposited adjacent the base oxide 702 at the portions where the base oxide 702 was removed, such as the portions of the base oxide that form at least one wall (or side) of the first area 1002, the walls of the second area 1004, the walls of the third area 1006 (see the enlarged view of the indicated area in FIG. 11), the walls of the fourth area 1008, and at least one wall of the fifth area 1010.

Further, another portion of the second oxide layer (indicated by second oxide layer 1102₂) can be deposited on the second side 106 and over the MPL 802₁.

The second oxide layer 1102₁ can be an intermediate layer for controlling a distance between the surface and the membrane stopper. It is noted that the membrane stopper is configured to control the distance to the surface. According to some implementations, the membrane stopper has a targeted distance of about 250 nm (plus or minus around 50 nm). The second oxide layer 1102₁ is an oxide layer that defines the distance during a release etch, which will be discussed in further detail below. The second oxide layer $1102_1$ (and the second oxide layer $1102_2$) can comprise silicon oxide, which can be a TS oxide deposited in the range of around 50 nm to about 100 nm, depending on the fabrication process. In some implementations, the second oxide layer $1102_1$ (and the second oxide layer $1102_2$) can have a targeted thickness of around 100 nm.

Figure 12:
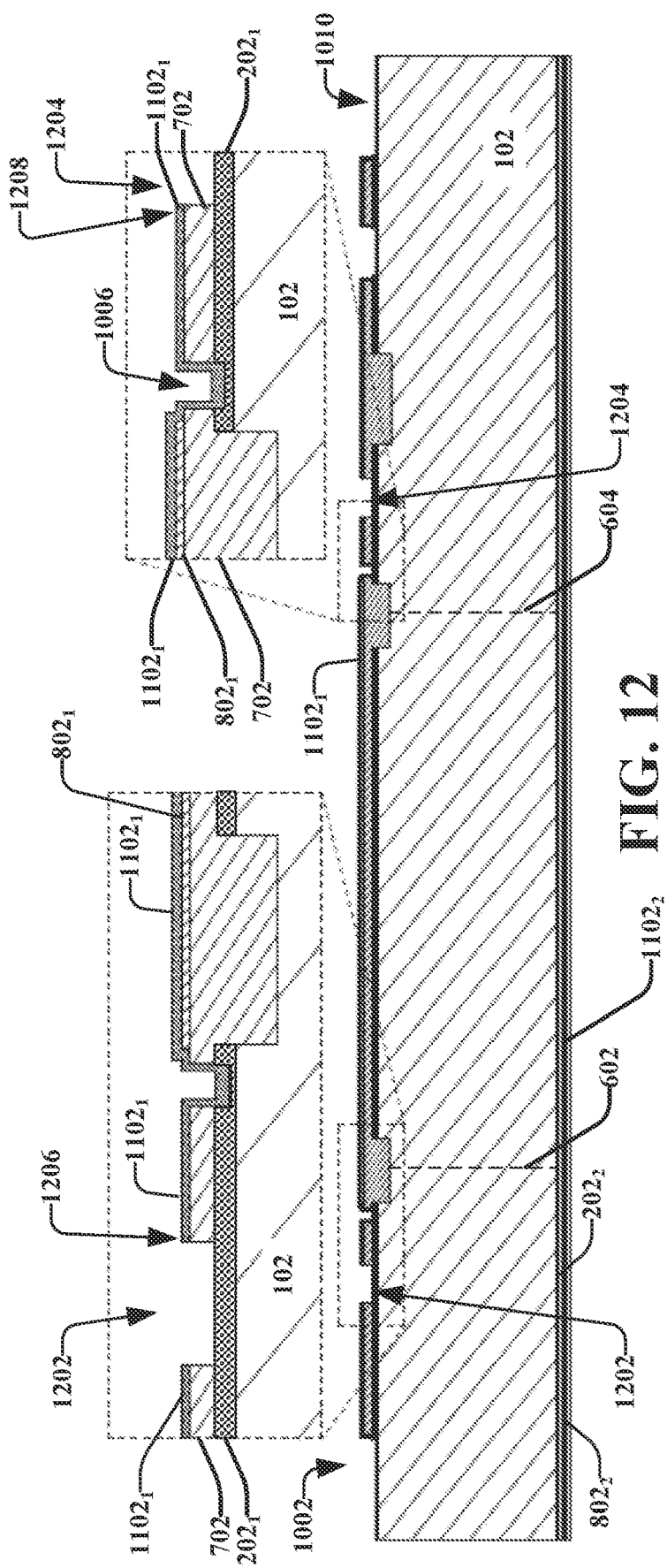

FIG. 12 illustrates structuring (e.g., opening) a first lateral etch stop (e.g., lateral etch stop 1). The lateral etch stop structuring can include etching the second oxide layer $1102_1$ and the base oxide 702 at one or more areas. For example, the second oxide layer $1102_1$ and the base oxide 702 can be etched at a first area 1202 (see enlarged portion on left side of FIG. 12) and at a second area 1204 (see enlarged portion on right side of FIG. 12). More specifically, the second oxide layer $1102_1$ and the base oxide 702 can be etched down to (or the etching can be stopped at) the first LSN thin film $202_1$ as indicated by the first area 1202 and the second area 1204. This etching can be referred to as an over-etch according to some implementations. Upon or after etching, a CMP process can be performed on the exposed first LSN thin film $202_1$. The first LSN thin film $202_1$ can comprise a thickness of around 50 nm according to some implementations.

The lateral etch stop can be structured in order to meet a defined specification for a corner radius. For example, the defined specification can be that the corner radius is to be more than around 100 nm. The corner radius area for the first area 1202 is indicated as a first corner 1206 (e.g., a first corner radius) and the corner radius area for the second area 1204 is indicated as a second corner 1208 (e.g., a second corner radius). The first corner 1206 and the second corner 1208 represent the two inner corner radiuses. The etch process can be designed to provide the required corner radius.

Optionally, second LSN thin film $202_2$ reinforcement deposition and etch (not shown in FIG. 12) can be performed during this stage of the fabrication process.

FIG. 13 illustrates an optional stage of the fabrication process that includes depositing and structuring (e.g., etching) a nitride reinforcement layer. For example, nitride reinforcement layer $1302_1$ can be deposited (at the first side 204) over and adjacent the second oxide layer $1102_1$, over and adjacent the base oxide 702, and over the first LSN thin film $202_1$. For example, the nitride reinforcement layer $1302_1$ can be deposited adjacent the base oxide 702 at walls defined for the first area 1202 and walls defined for the second area 1204. Further, the nitride reinforcement layer $1302_1$ can be deposited over the first LSN thin film $202_1$ at the bottom of the first area 1002 and the bottom of the fifth area 1010.

This stage of the fabrication process can be referred to as a membrane LSN1 deposition. Additionally, nitride reinforcement layer $1302_2$ can be deposited over the second oxide layer $1102_2$ at the second side 206.

Further, as illustrated in FIG. 14, a first membrane nitride layer can be deposited. For example, the first membrane nitride layer $1402_1$ can be deposited over and adjacent the nitride reinforcement layer $1302_1$. Further, another first membrane nitride layer $1402_2$ can be deposited, at the second side 206, over the nitride reinforcement layer $1302_2$. The first membrane nitride layer can be a membrane In-Situ Doped Polysilicon (ISDP), which can be deposited and annealed.

Figure 15:
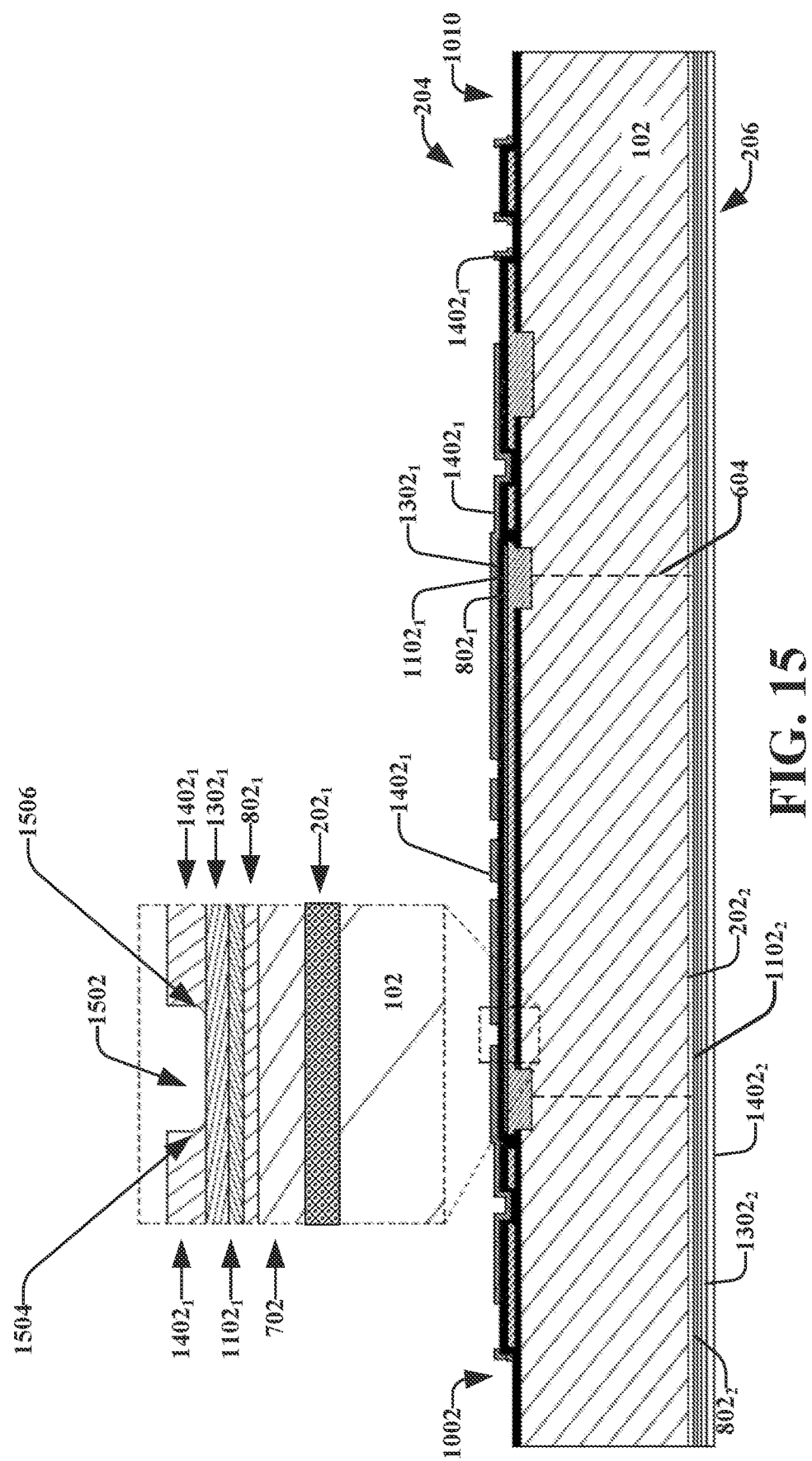

FIG. 15 illustrates a next stage of the fabrication process that includes etching the first membrane nitride layer $1402_1$. A trench 1502 is formed (etched) in the first membrane nitride layer $1402_1$. For example, the first membrane nitride layer $1402_1$ can be etched (down) to a top surface of the nitride reinforcement layer $1302_1$. The trench 1502 can comprise bottom corners, illustrated as first corner 1504 and a second corner 1506. The corners can have a respective radius specifications of more than about 50 nm. The trench width can be 8 µm or 4 µm reinforcement.

According to some implementations, other processes that can be performed include definition of an active electrode area and shield. Another process can include opening ventilation hole area in ISDP (8 µm). Further, opening of bulk contact, with donut, can be performed. Additionally, opening of the scribe line can be performed while leaving edge cover on scribe. Another process can be definition of die ID.

Figure 16:
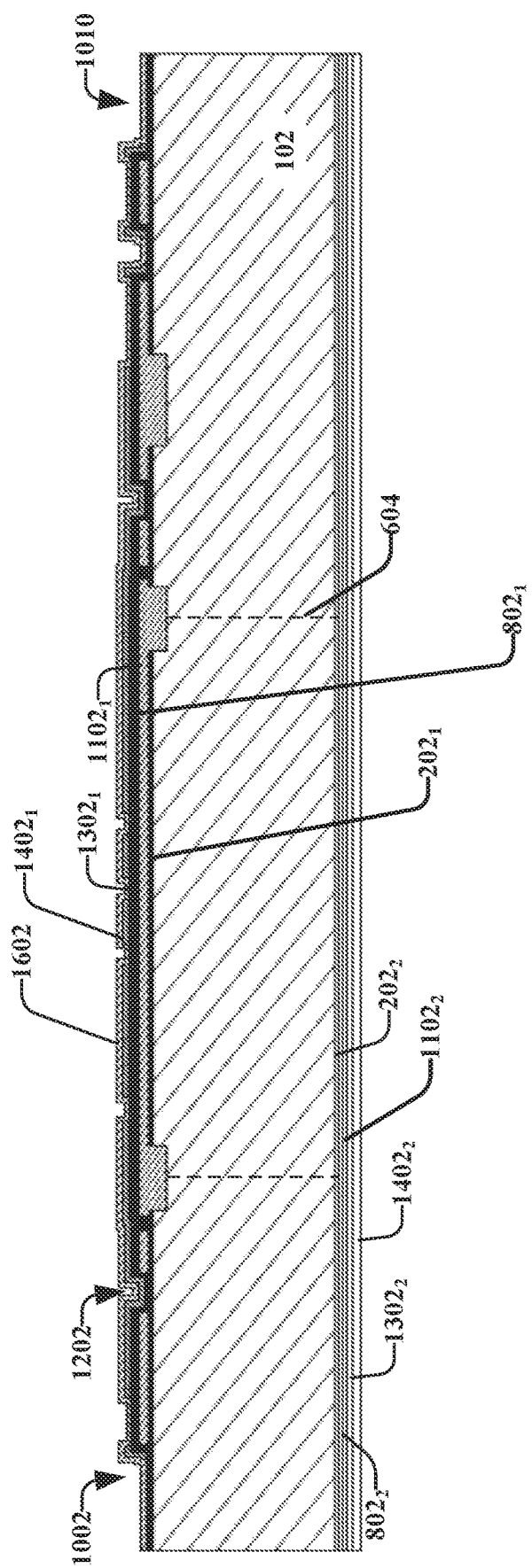

An oxide reinforcement layer 1602 can be deposited over and adjacent the first membrane nitride layer $1402_1$ and over the nitride reinforcement layer $1302_1$, as illustrated in FIG. 16. This step can also be referred to a top reinforcement deposition.

Figure 17:
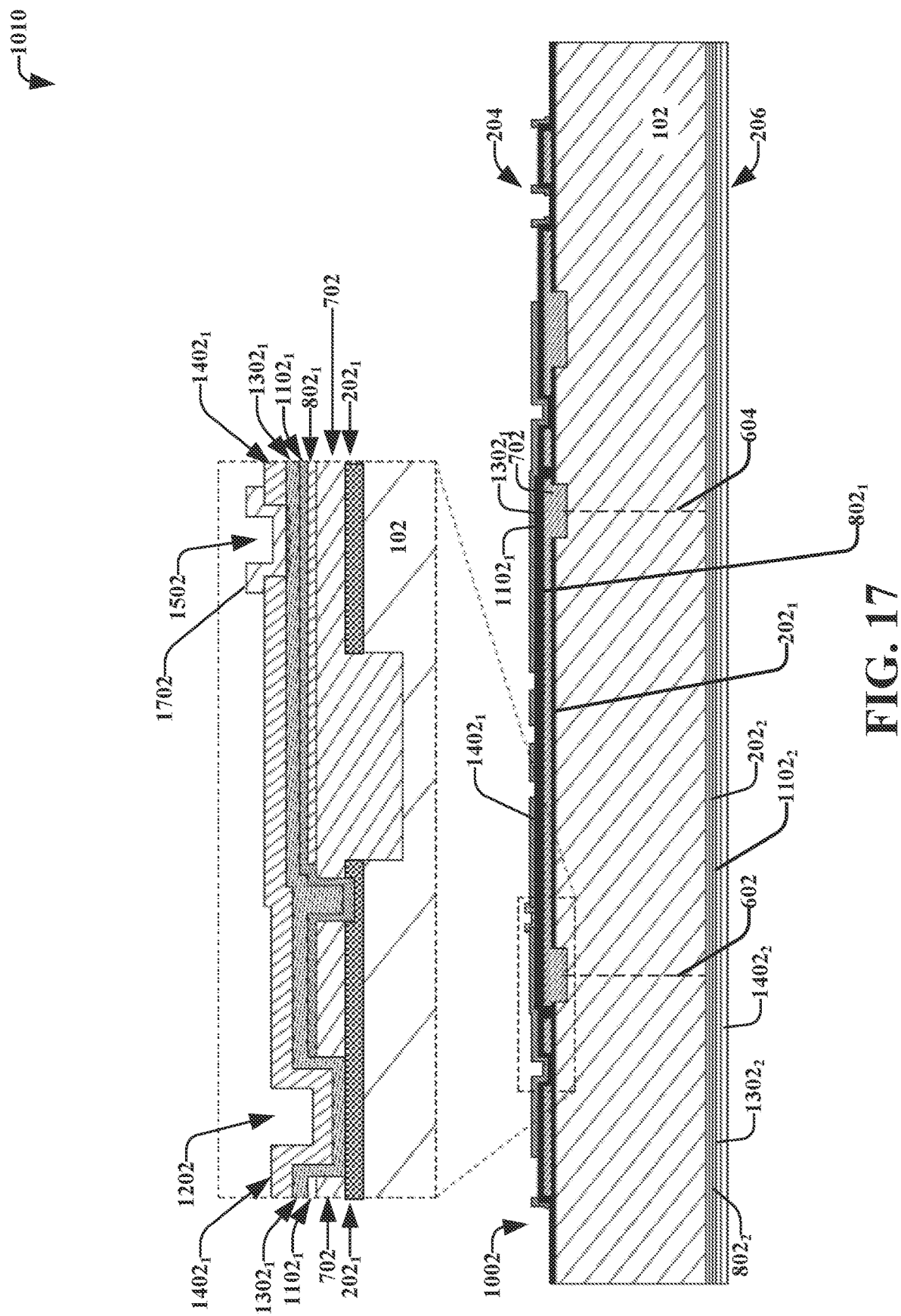

FIG. 17 illustrates structuring of the oxide reinforcement layer 1602. As illustrated, in the enlarged portion, various portions of the oxide reinforcement layer 1602 can be removed (e.g., etched). After the etching, the portion of the oxide reinforcement layer 1602 at the trench 1502 remains (indicated at 1702 in the enlarged portion of FIG. 17).

Figure 18:
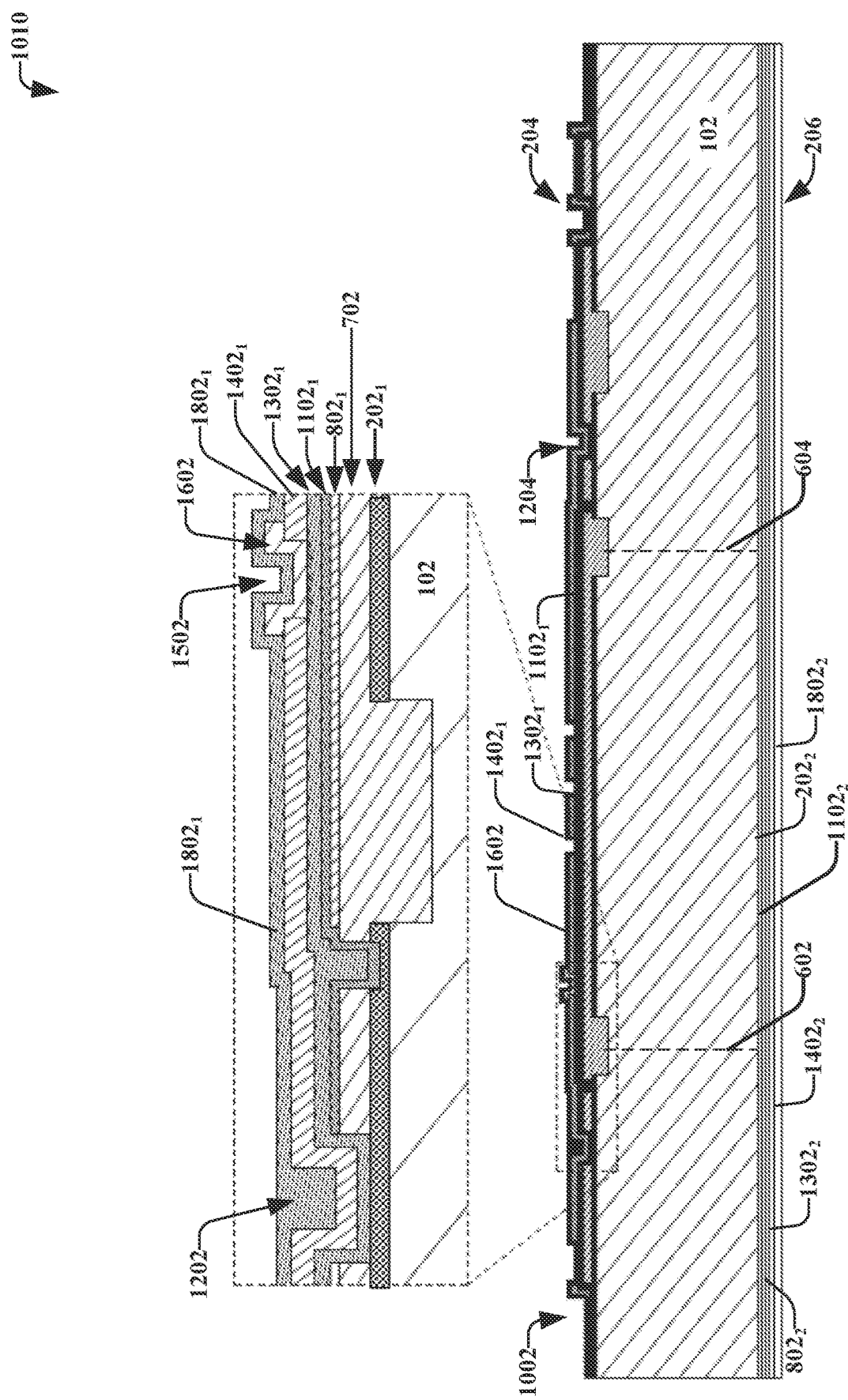

A next stage of the fabrication process includes deposition of a second membrane nitride layer, as illustrated in FIG. 18. The second membrane nitride layer can be a LSN thin film, according to some implementations. For example, second membrane nitride layer $1802_1$ can be deposited adjacent and over the first membrane nitride layer $1402_1$. Further, the second membrane nitride layer $1802_1$ can be deposited adjacent and over the portion of the oxide reinforcement layer 1602 over the trench 1502. Additionally, the second membrane nitride layer $1802_1$ can be deposited over the first LSN thin film $202_1$. Further, second membrane nitride layer $1802_2$ can be deposited over the first membrane nitride layer $1402_2$ on the second side 206 of the wafer.

FIG. 19 illustrates creation of one or more ventilation holes. The one or more ventilation holes can be formed by etching down through the second membrane nitride layer $1802_1$ and the first membrane nitride layer $1402_1$. As illustrated, one or more ventilation holes can be formed, as indicated by first ventilation hole 1902, second ventilation hole 1904, and third ventilation hole 1906. Although three ventilation holes are illustrated and described, in some implementations, another number of ventilation holes can be formed.

Next, a third oxide layer 2002 is deposited, as illustrated in FIG. 20. The third oxide layer 2002 can be deposited over and adjacent the second membrane nitride layer $1802_1$ and over the first LSN thin film $202_1$ (e.g., at the first area 1002 and at the fifth area 1010). The third oxide layer can also be referred to as a first airgap oxide (e.g., airgap oxide 1).

Dimple formation and second Lateral Etch Stop (LES2) definition can be performed as illustrated in FIG. 21. As indicated, one or more dimples and the second lateral etch stop can be formed (e.g., opened) in the third oxide layer 2002. For example, the one or more dimples and second lateral etch stop can be formed (e.g., etched) in the third oxide layer 2002. FIG. 22 illustrates a next stage of the fabrication process that includes depositing a fourth oxide layer 2202. The fourth oxide layer 2202 can also be referred to as an airgap oxide 2 deposition.

Figure 23:
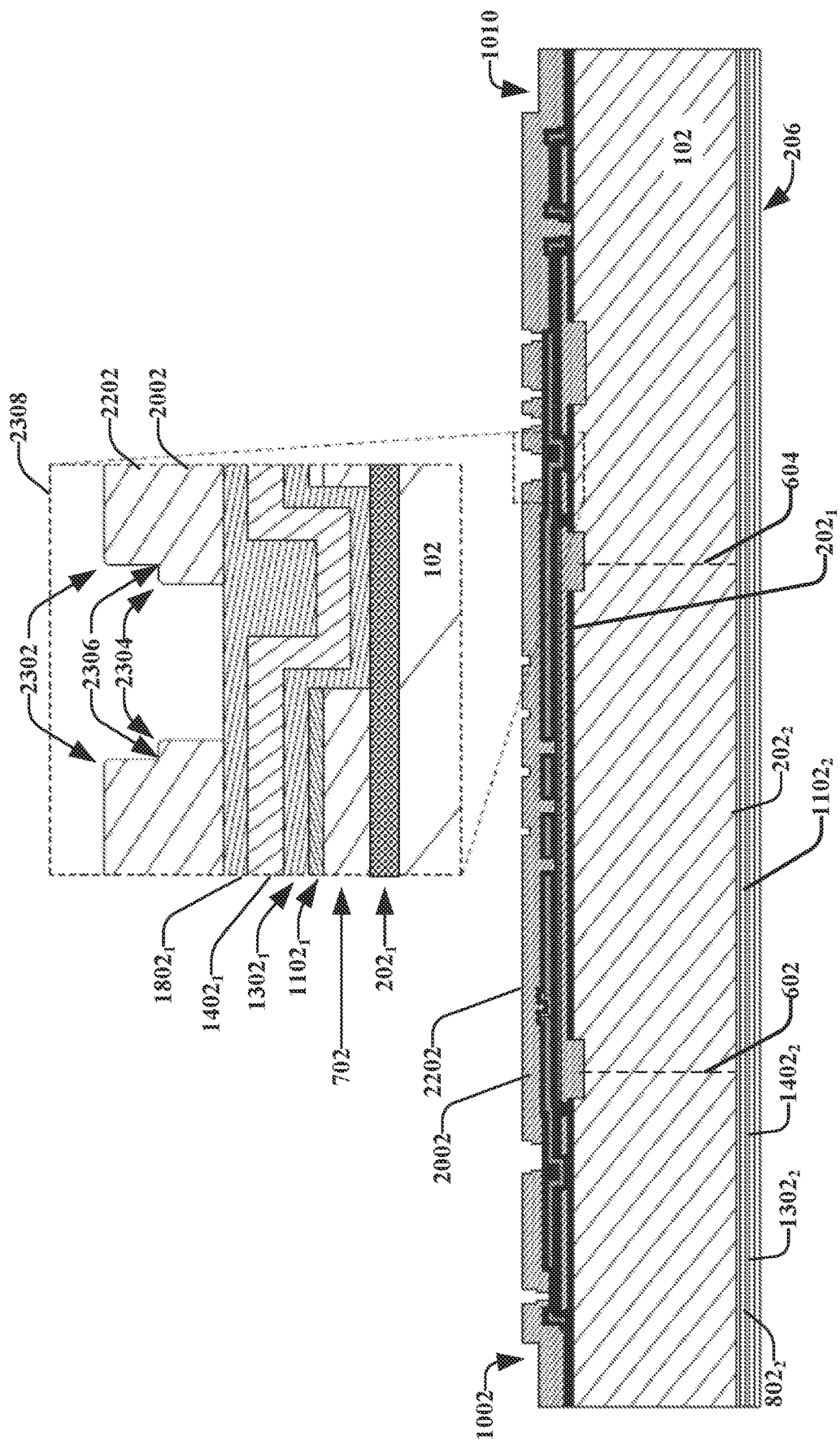

FIG. 23 illustrates opening the second lateral etch stop area, which can include structuring and etching. Opening the second lateral etch stop area can include etching the third oxide layer 2002 and the fourth oxide layer 2202.

There are two corner radiuses on the lateral etch stops, illustrated as a first corner 2302 and a second corner 2304. The first corner 2302 can have a radius of more than about 100 nm. The second corner 2304 can have a radius of more than 25 nm. Further, a step width 2306 (lateral step width) can be around 4 μm. It is noted that the radius is toward the center of the microphone (indicated within the enlarged portion 2308).

The process of forming the two radiuses (e.g., at the first corner 2302 and at the second corner 2304) can be a two mask process. For example, the areas on the two outer edges can be structured. Then oxide can be deposited. Upon or after deposition of the oxide, the areas on the two inner edges can be defined. Thus, first the wide portion then the narrow trench is defined.

Figure 24:
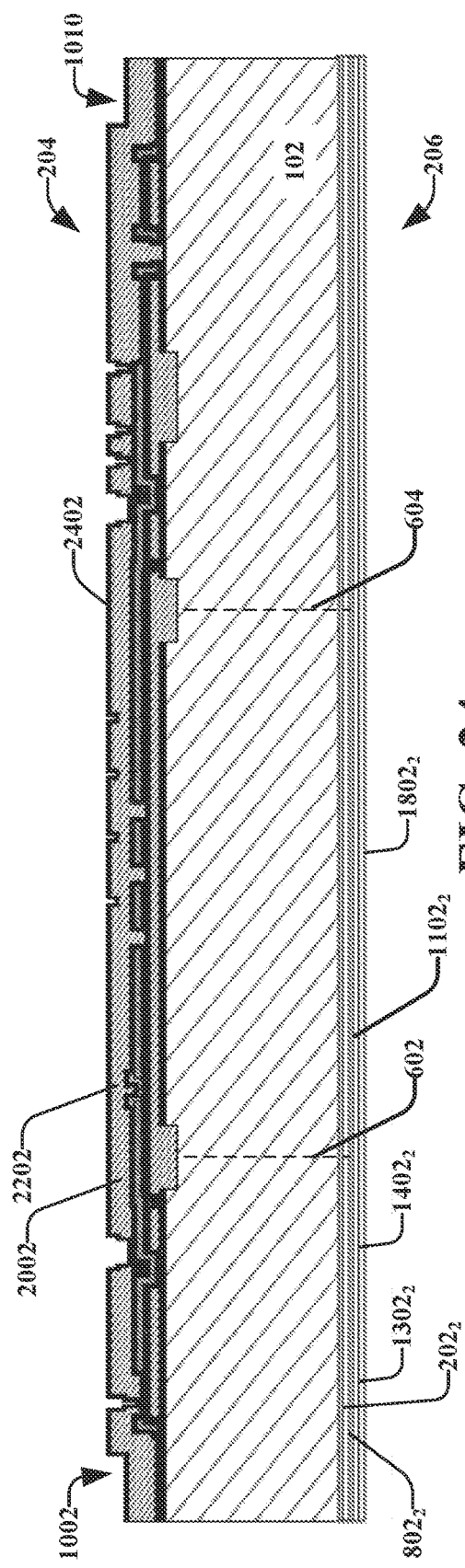

FIG. 24 illustrates deposition of backplate nitride underlayer 2402, which can be an LSN underlayer. The backplate nitride underlayer 2402 can be deposited over and adjacent the fourth oxide layer 2202 and adjacent respective portions of the third oxide layer 2002.

The backplate nitride underlayer 2402 can improve robustness at the LES 2 specification, which can be more than around 50 nm. The backplate nitride underlayer 2402 can improve the strength of the backplate. For example, the strength of the nitride can be higher than the strength of the polysilicon in the backplate (e.g., during bending, the nitrite has a much higher breaking point compared to polysilicon). Therefore, having the nitride underlayers (e.g., the backplate nitride underlayer 2402) can improve the strength of the backplate.

Figure 25:
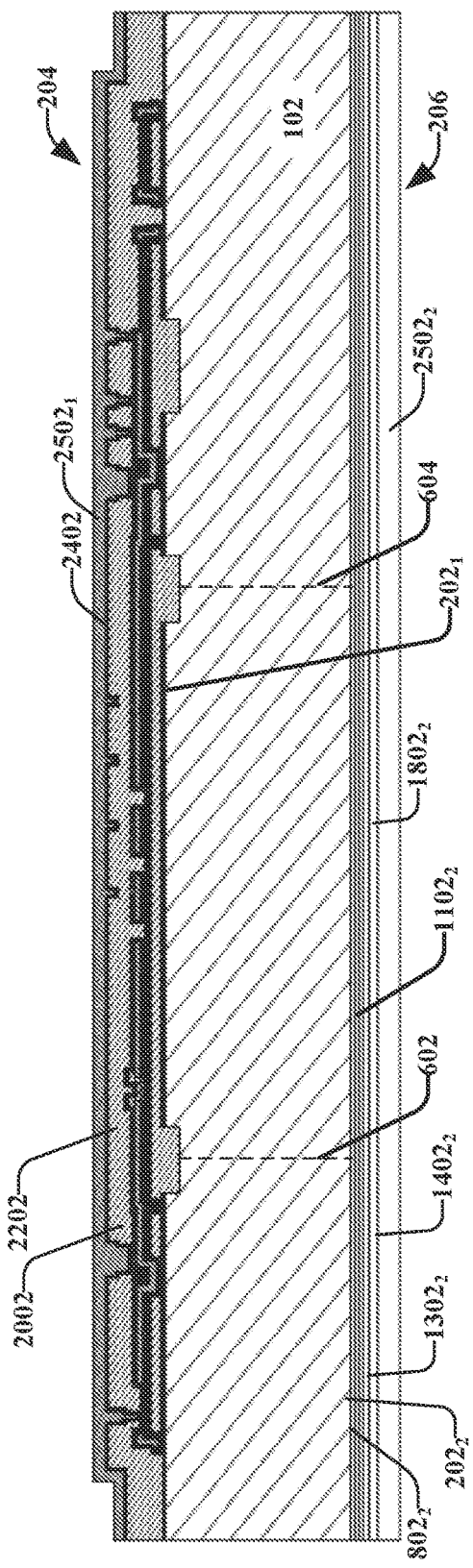

FIG. 25 illustrates stages of a fabrication process for deposition of a first backplate polysilicon layer. First backplate polysilicon layer $2502_1$ can be deposited over and adjacent the backplate nitride underlayer 2402. Stress anneal can also be performed. Further, at the second side 206, first backplate polysilicon layer $2502_1$ can be deposited over the second membrane nitride layer $1802_2$. The first backplate polysilicon layer can also be referred to as a top backplate and is part of a rigid plate.

Figure 26:
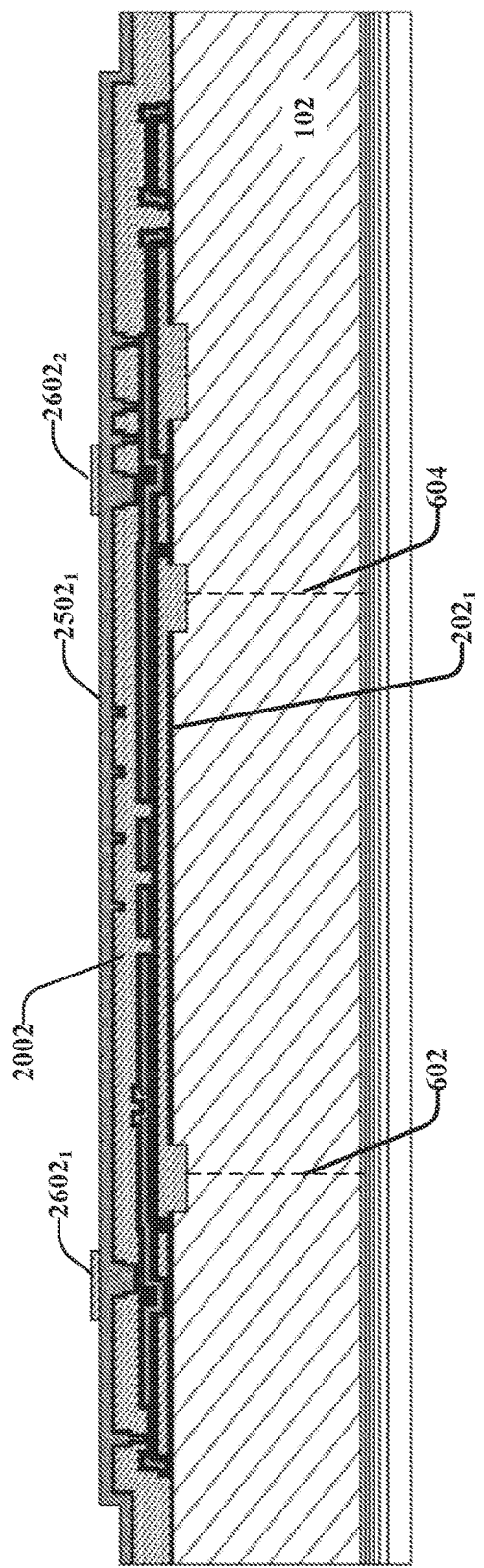

FIG. 26 illustrates deposition, structuring, and etching of a fifth oxide layer. The fifth oxide layer can be a stress distributor, also referred to as a top backplate stress distributor. The fifth oxide layer can be deposited over the first backplate polysilicon layer 2502 and etched, forming two portions of the fifth oxide layer (indicated as fifth oxide layer $2602_1$ and $2602_2$). According to some implementations, the stress distribution can comprise nitride, oxide, or another material layer.

In this stage of the fabrication process, a (small) nitride layer (e.g., fifth oxide layer $2602_1$ and $2602_2$) is added between the two backplane parts (e.g., the top backplate as discussed with respect to FIG. 26 and a second backplate layer, which will be discussed with respect to FIG. 27 below) in order to increase the bending stiffness at the suspension of the backplate. The stress distributor can facilitate making the complete structure stiffer and more robust than the structure would be without the stress distributor.

Figure 27:
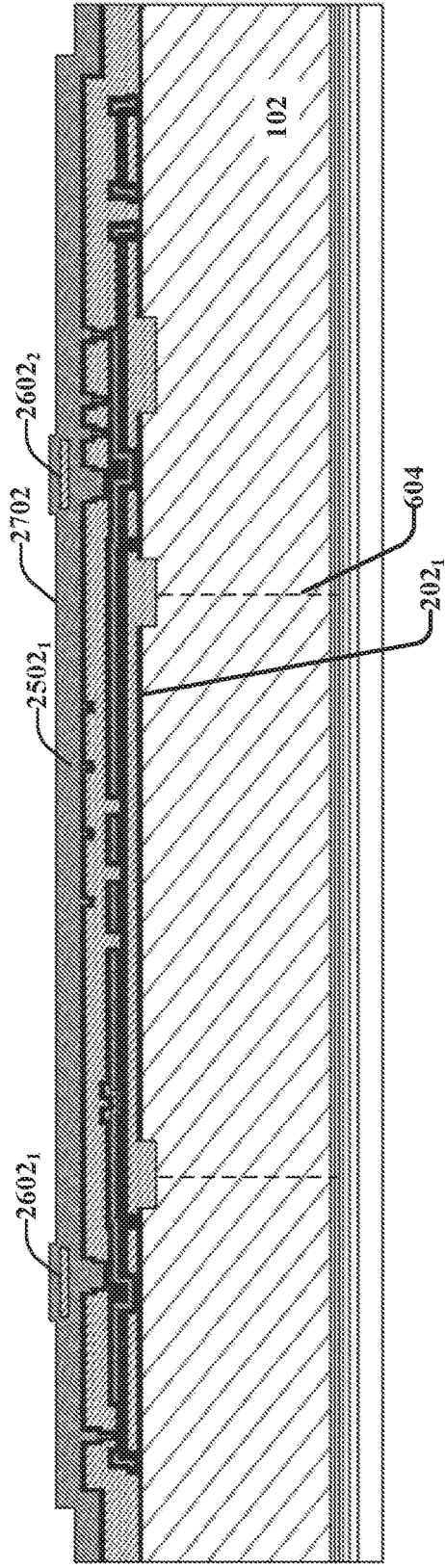

A second layer of polysilicon (e.g., a second backplate polysilicon layer 2702) can be deposited to form a second portion of the backplate, as illustrated in FIG. 27. The second backplate polysilicon layer 2702 can be deposited over the first backplate polysilicon layer 2502 and the fifth oxide layer (e.g., fifth oxide layer $2602_1$ and $2602_2$). The first backplate polysilicon layer 2502, the fifth oxide layer, and the second backplate polysilicon layer can form a rigid plate.

Figure 28:
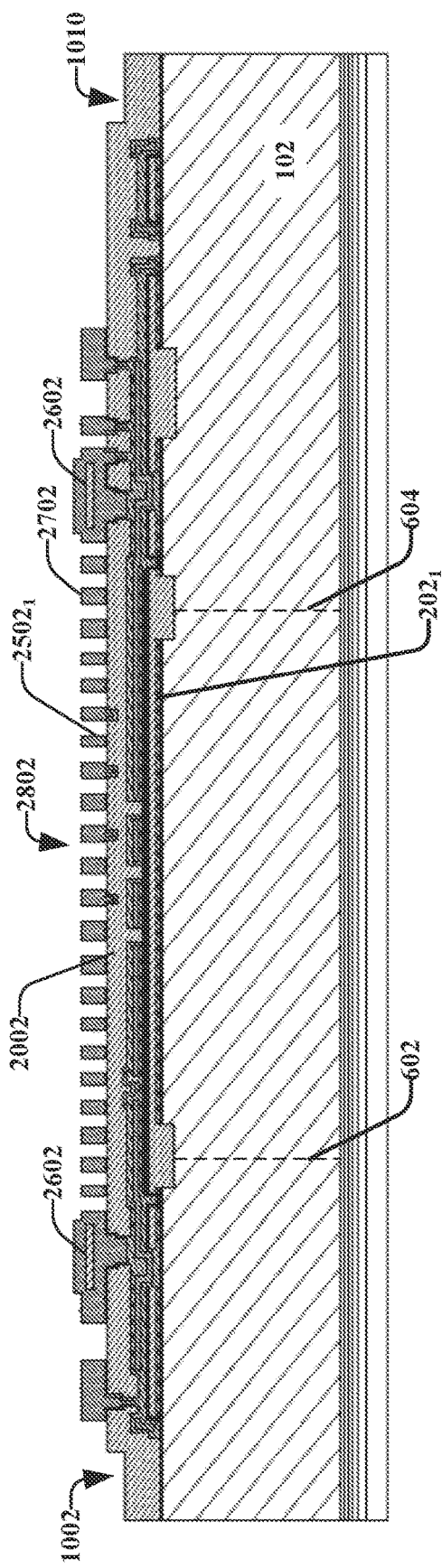

FIG. 28 illustrates definition (e.g., structuring) of the first backplate polysilicon layer 2502 and the second backplate polysilicon layer 2702. For example, etching of the first backplate polysilicon layer 2502 and the second backplate polysilicon layer 2702 can be performed, as indicated, at 2802. Further, LSN hole structuring can be performed.

Figure 29:
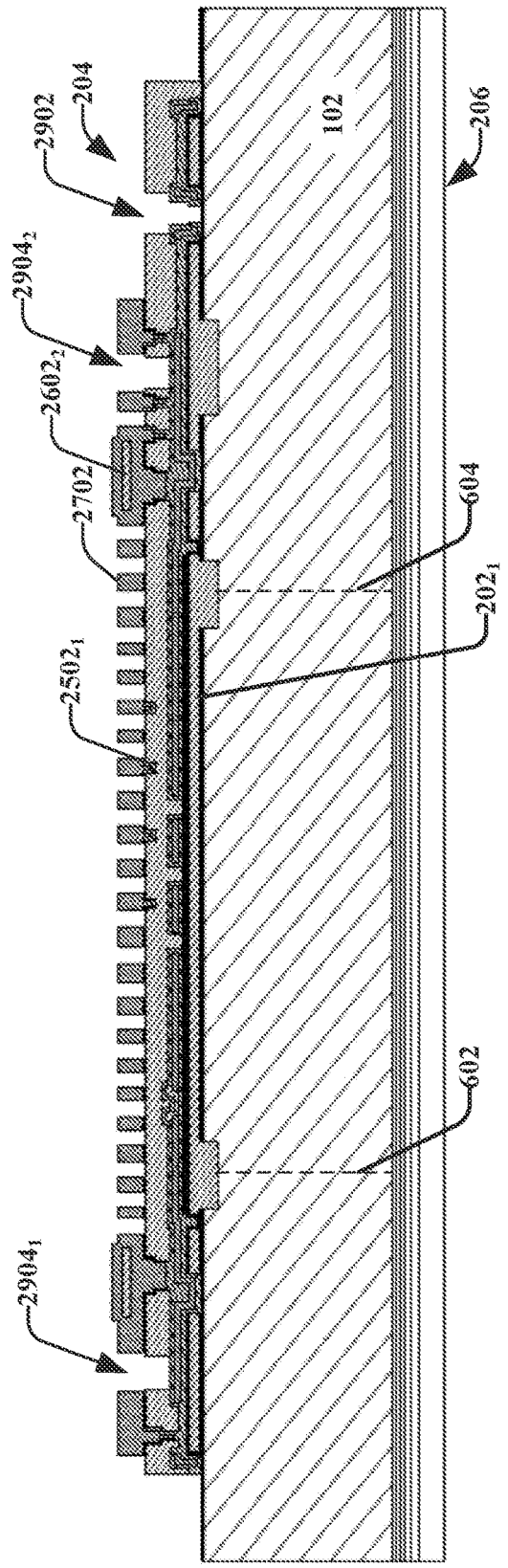
Figure 30:
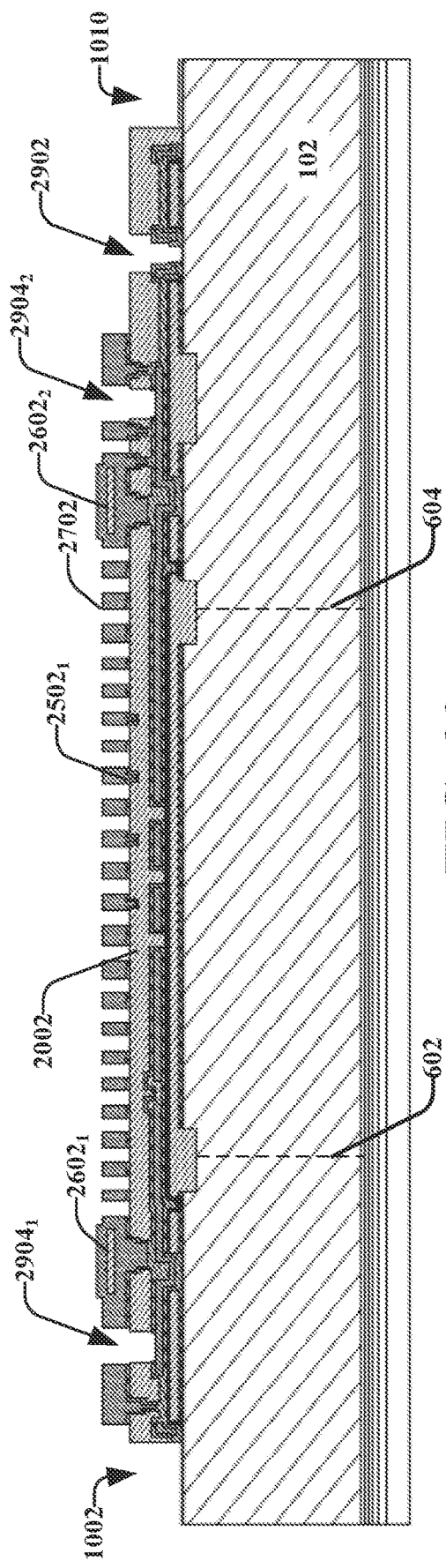

Contact 1 opening integration can be performed during a next stage of the fabrication process, as illustrated in FIG. 29. Opening the first contact can be facilitated via an oxide etch. For example, a first contact 2902 can be opened to the wafer 102 via the oxide etch. Further, second contacts $2904_1$ and $2904_2$ can be opened to bulk opening of contact to shield-contact. In an example, the first oxide can be etched dry, and then the nitride layer can be etched in a pattern to contact the membrane. FIG. 30 illustrates an LSN etch that integrates a second contact.

Figure 31:
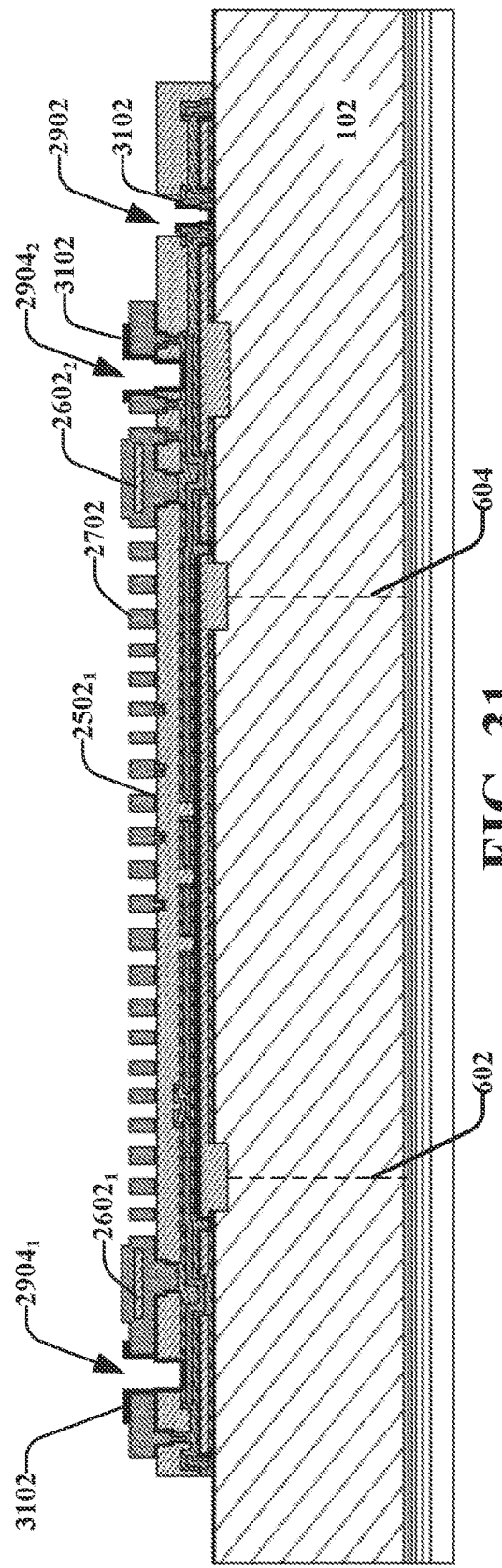

FIG. 31 illustrates metal deposition structuring and etch. One or more portions of metal 3102 can be deposited within one or more second contacts $2904_1$ and $2904_2$. Accordingly, metal 3102 can be deposited over and adjacent the second backplate polysilicon layer 2702, over the first backplate polysilicon layer 2502, and over the nitride reinforcement layer $1302_1$ and the first LSN thin film $202_1$ (e.g., in the first contact 2902). The metal 3102 can be etched such that only portions of the metal at the one or more second contacts remain. Thus, a first portion of the metal 3102 can line the bottom and sides of second contact $2904_1$. Further, a second portion of the metal 3102 can line the bottom and sides of second contact $2904_2$.

Figure 32:
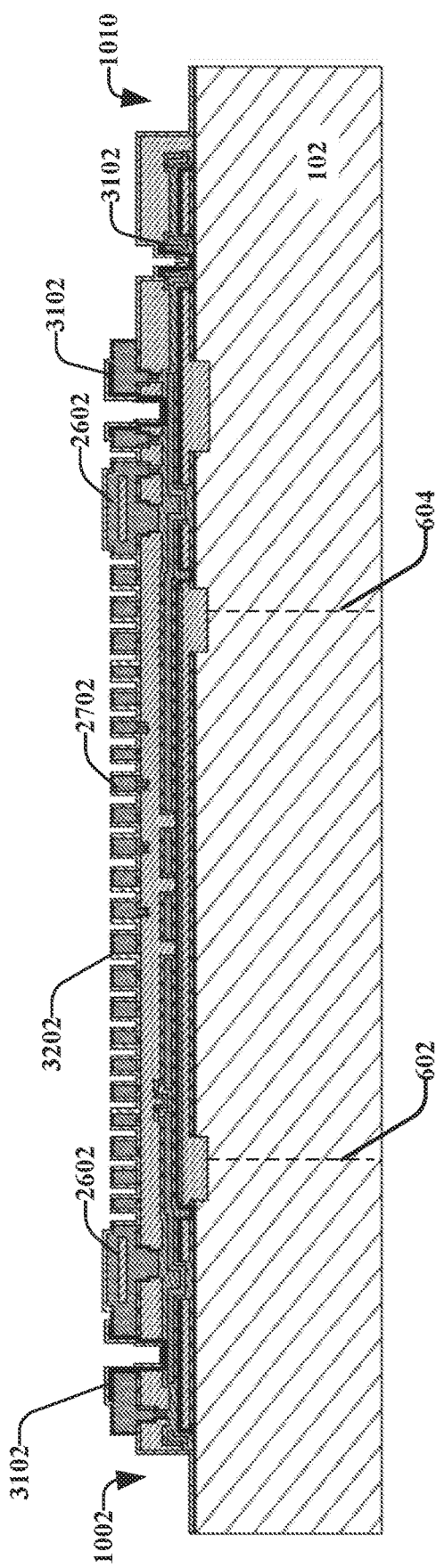

During a next stage of the fabrication process, frontside protection and grinding can be performed, as illustrated in FIG. 32. As indicated, frontside oxide protection 3202 can be deposited over and adjacent the first backplate polysilicon layer 2502 and the metal 3102. After deposition of the frontside oxide protection 3202, the wafer can be thinned to a desired thickness. For example, the wafer can be thinned to 350 micron, for example.

Figure 33:
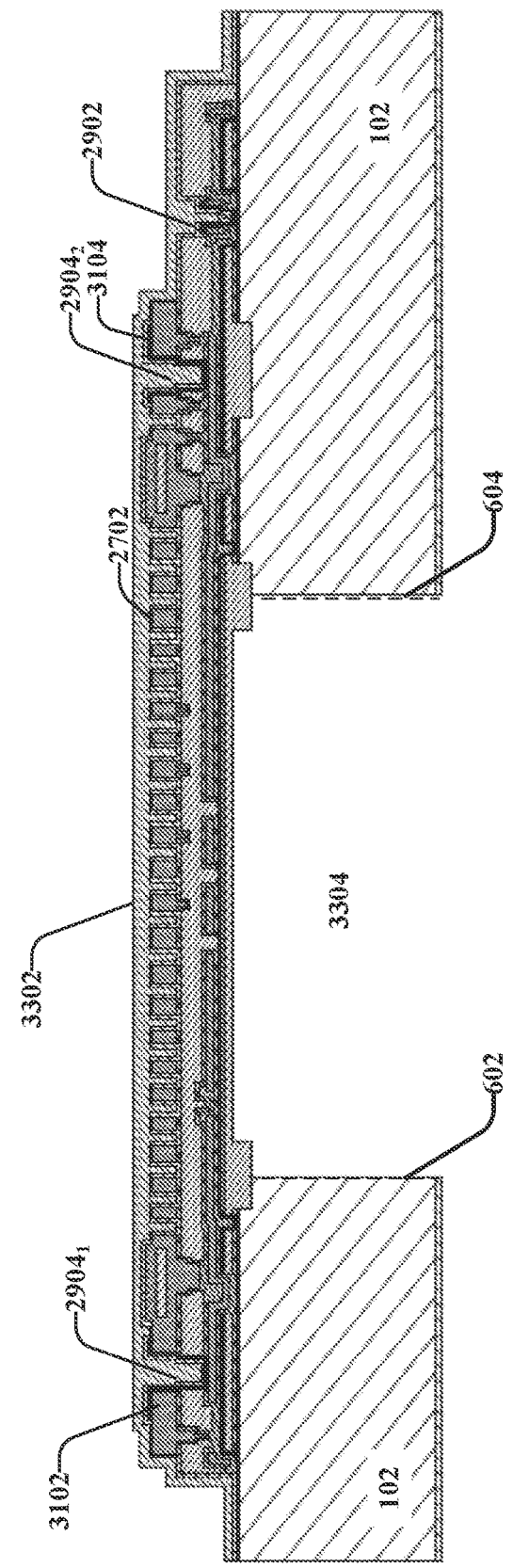

Next, backside cavity definition and etch can be performed, as illustrated in FIG. 33. As indicated frontside resist protection 3302 can be provided. Further, a cavity 3304 can be defined on a backside (e.g., second side 206) of the wafer. Defining the cavity 3304 can include structuring and etching portions of the wafer 102 and respective portions of the backside layers (e.g., the second LSN thin film $202_2$, the MPL $802_2$, the second oxide layer $1102_2$, the nitride reinforcement layer $1302_2$, the first membrane nitride layer $1402_2$, and the second membrane nitride layer $1802_2$.

The cavity 3304 can be defined between the centers of the respective centers of the front cavities (indicated by the first dashed line 602 for the first cavity $302_1$ and the second dashed line 604 for the second cavity $302_2$). According to an optional implementation, a photo resist for Xenon Difluoride (XeF2) poly can be kept during a silicon remove process.

Figure 34:
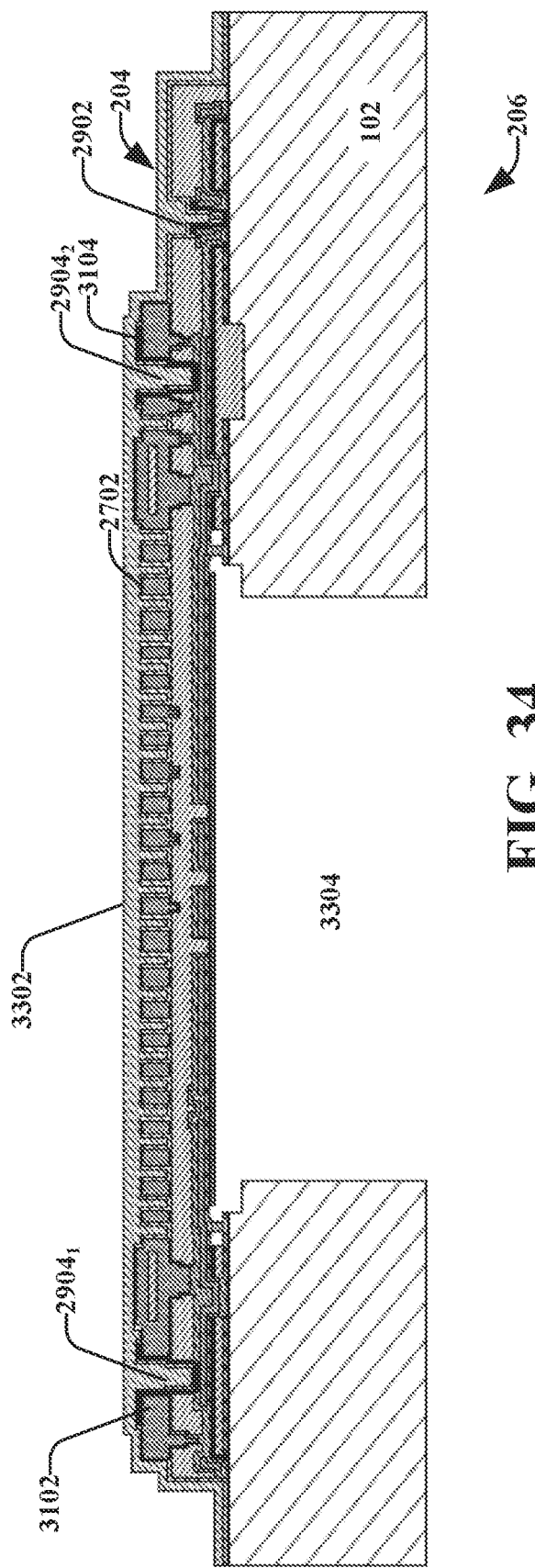
Figure 35:
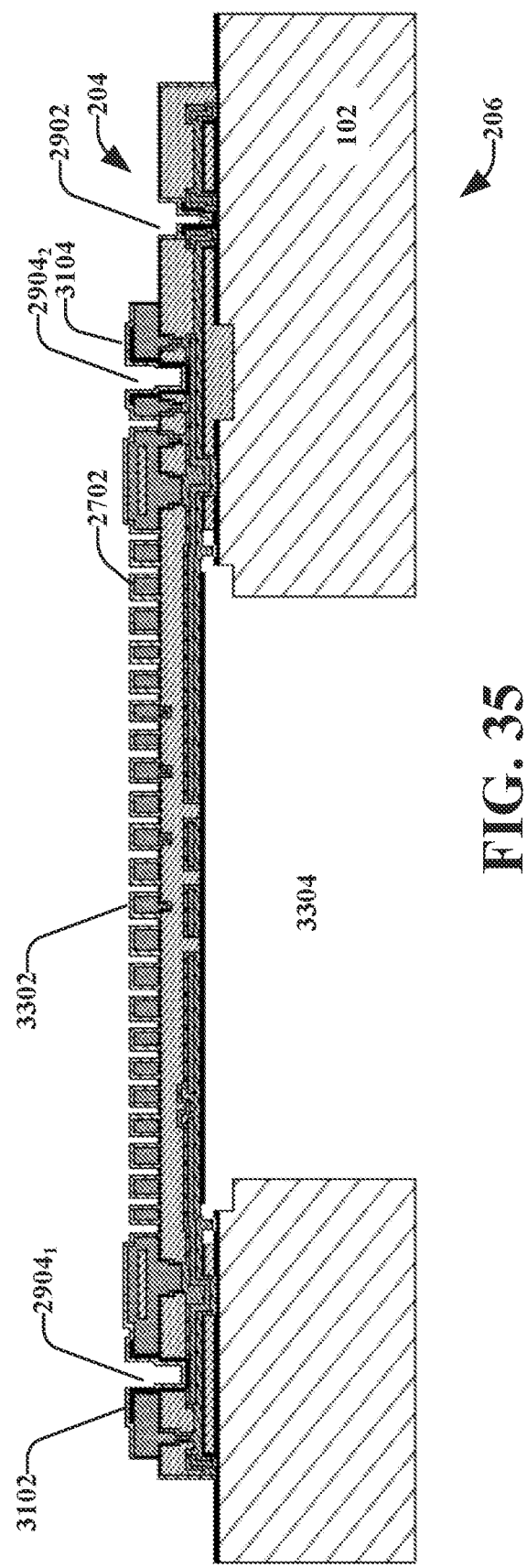
Figure 36:
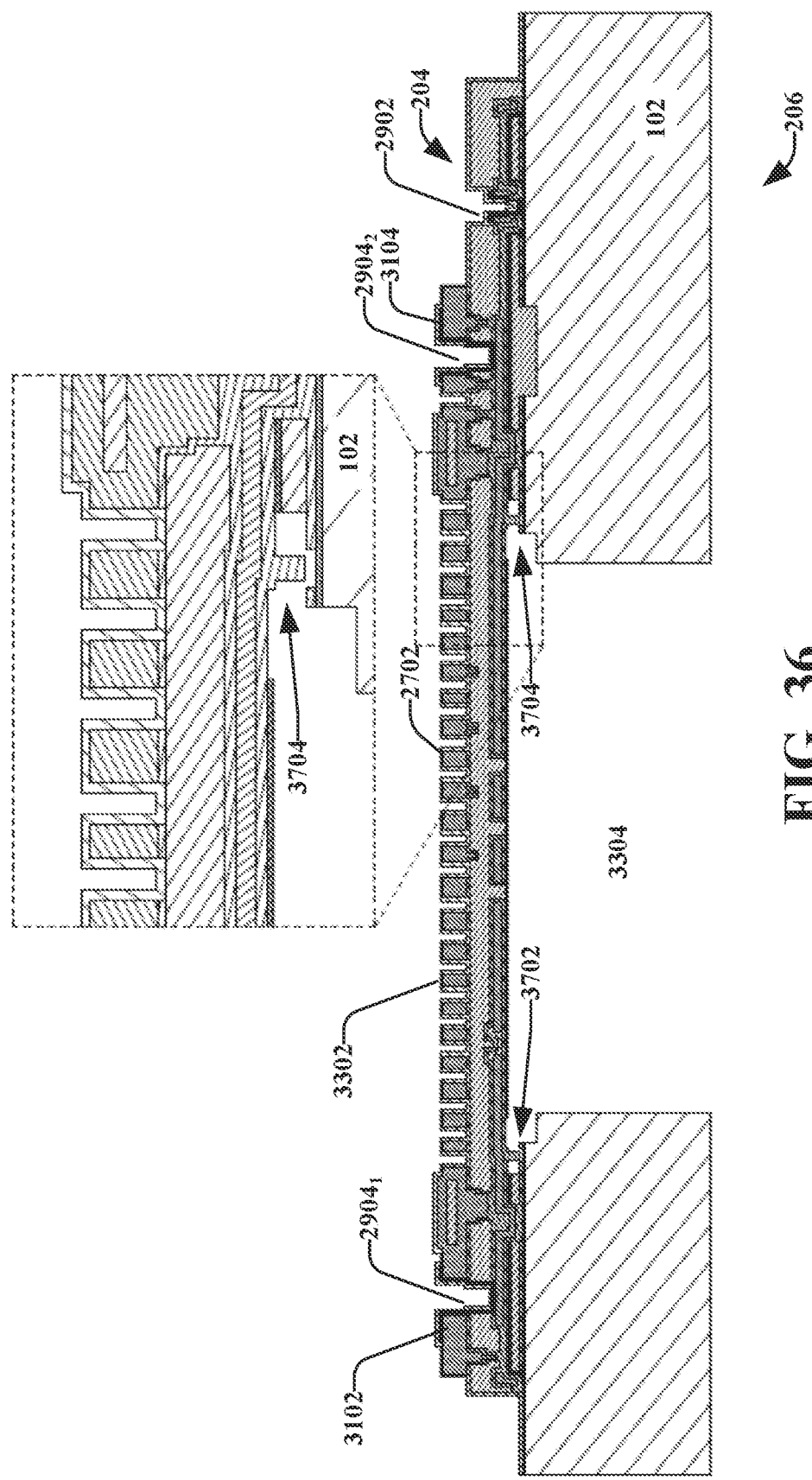

FIG. 34 illustrates a first release of the defined structure (e.g., the structure fabricated with respect to FIGS. 1-33). The first release (or initial release) can comprise Buffered Oxide Etch (BOE) pre-release using buffered oxide that includes front resist removal, as illustrated in FIG. 35. This process can be a wet pre-release process. During the BOE pre-release, the long distance, in the range of 20 micron laterally, is being etched. During the BOE pre-release the membrane is being protected by the thin polysilicon. The term "release" means that all sacrificial material should be removed. As illustrated in FIG. 34, the resist is removed, then, in the next step, the sacrificial membrane protection layer is removed. FIG. 36 illustrates the membrane protection layer. Thereafter, a second release of the structure can be facilitated. This can include removal of the polysilicon. The polysilicon can be removed in a xenon difluoride process. Thereafter, the front side resist is removed. Further, a Self-Assembled Monolayer (SAM) coating can be applied to the structure.

Figure 37:
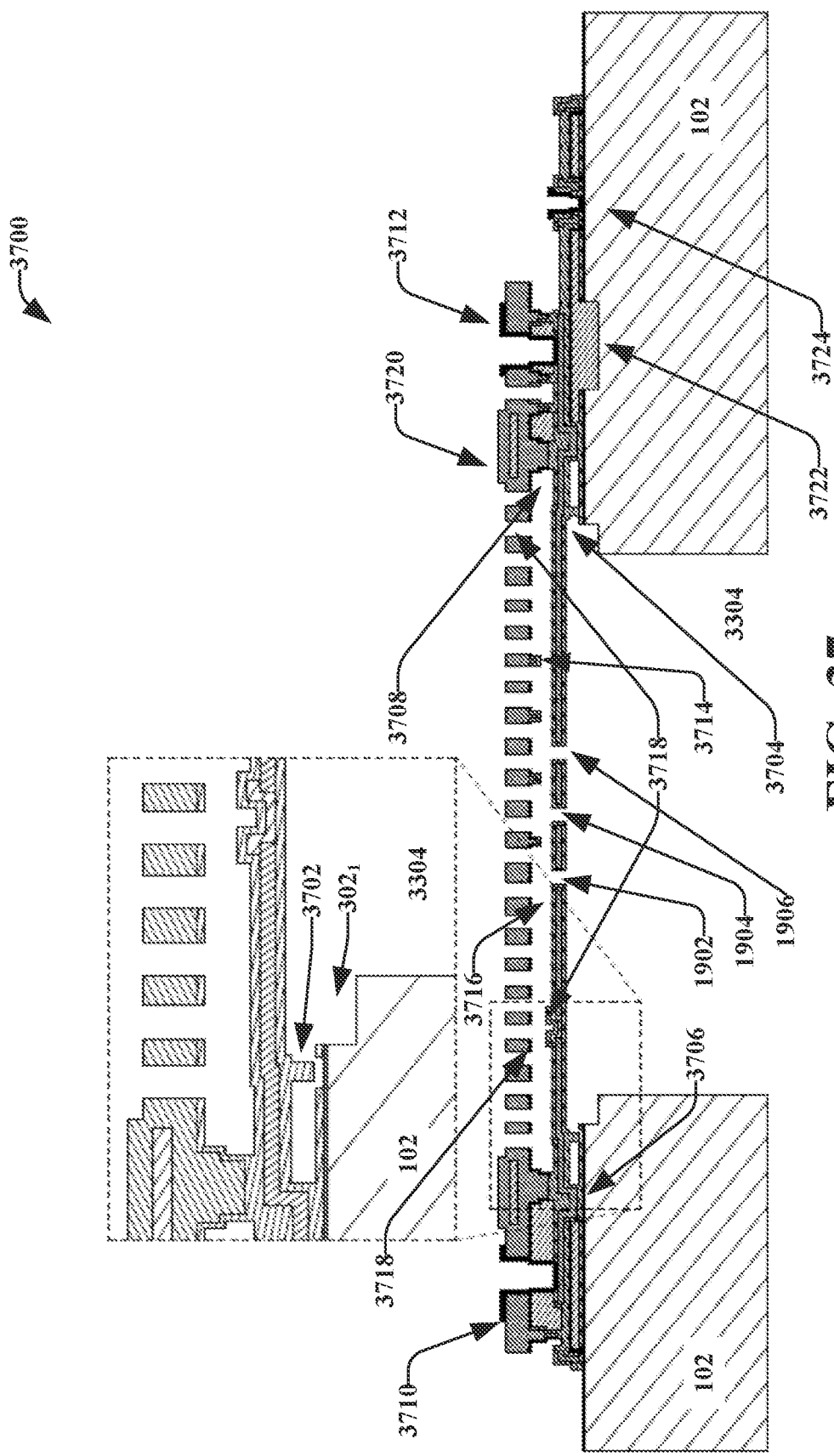
FIG. 37 illustrates an example representation of a MEMS microphone according to one or more embodiments described herein.

FIG. 37 illustrates example representation of a MEMS microphone 3700 according to one or more embodiments described herein. Illustrated is a front cavity (e.g., the first cavity $302_1$ and the second cavity $302_2$), which are utilized to control bending of a flexible plate towards the cavity 3304. Further, there is no touching of the flexible plate at the edge of the cavity when the flexible plate moves towards the cavity. For example, the flexible plate moves or is deformed by a pressure wave. Controlling the movement can improve a robustness of the flexible plate when it is deformed by the pressure wave. In some implementations, the pressure wave can include a threshold amplitude.

Additionally, membrane stoppers (illustrated as a first membrane stopper 3702 and a second membrane stopper 3704) can assist with the control of the flexible plate. Since the microphone can be relatively large, the front membrane and the membrane stoppers work together to stop or restrict movement of the flexible plate downward. Also illustrated are a lateral etch stop 3706 and a reverse bending edge, with lateral etch stop 3708.

The shield TP contact 3710 and a membrane node (raised to TP) 3712 are also indicated on the MEMS microphone 3700. An LSN underlayer 3714 and a dimple 3716 are also indicated in FIG. 37. In the MEMS microphone 3700 a membrane trench separates the active and the shield 3718. A buried oxide stress reduction feature 3720 is also provided. Parasitic reduction (MEM—boot) 3722 and the bulk/boot node 3724 are indicated. The MEMS microphone 3700 also includes membrane trench oxide on top reinforcement 3726.

FIG. 38 illustrates a further example representation of a MEMS microphone 3800 according to one or more embodiments described herein. Repetitive description of like elements employed in other embodiments described herein is omitted for sake of brevity. The MEMS microphone 3800 can comprise one or more of the components and/or functionality of the MEMS microphone 3700 and vice versa. The MEMS microphone 3800 is similar to the MEMS microphone 3700 but does not include the oxide reinforcement (e.g., the membrane trench oxide on top reinforcement 3726). It is noted that the perforated flexible plate can improve the signal. Accordingly, reinforcement of the trench has been provide herein. The reinforcement can be oxide, nitride, or another material.

FIG. 39 illustrates another example representation of a MEMS microphone according to one or more embodiments described herein. Repetitive description of like elements employed in other embodiments described herein is omitted for sake of brevity. The MEMS microphone 3900 can comprise one or more of the components and/or functionality of the MEMS microphone 3700, the MEMS microphone 3800, and vice versa. The MEMS microphone 3900 is similar to the MEMS microphone 3800. However, the MEMS microphone 3900 includes bottom LSN reinforcement 3902.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics can be combined in any suitable manner in one or more embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, the various embodiments can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, machine-readable device, computer-readable carrier, computer-readable media, machine-readable media, computer-readable (or machine-readable) storage/communication media. For example, computer-readable media can comprise, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media. Of course, those skilled in the art will recognize many modifications can be made to this configuration without departing from the scope or spirit of the various embodiments The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the subject matter has been described herein in connection with various embodiments and corresponding figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A microelectromechanical microphone device comprising:
a flexible plate that is deformable by a pressure wave, the flexible plate comprising a reverse bending edge comprising a first lateral etch stop comprising a first corner radius and a second lateral etch stop comprising a second corner radius different than the first corner radius;

a rigid plate mechanically coupled to the flexible plate, the rigid plate comprising openings configured to permit passage of the pressure wave; and a stoppage member affixed to the rigid plate and extending perpendicular relative to a surface of the rigid plate opposite the surface of the flexible plate, wherein the stoppage member is configured to limit motion of the flexible plate in response to the pressure wave.

2. The microelectromechanical microphone device of claim 1, wherein the first corner radius is more than 100 nanometers, and wherein the second corner radius is more than 25 nanometers.

3. The microelectromechanical microphone device of claim 2, wherein a lateral step width between the first corner radius and the second corner radius is less than around 4 micrometers.

4. The microelectromechanical microphone device of claim 1, wherein the rigid plate comprises a stress distributor located between layers of polysilicon.

5. The microelectromechanical microphone device of claim 4, wherein the stress distributor comprises a nitride layer.

6. A microelectromechanical microphone device comprising:

a flexible plate that is deformable by a pressure wave;

a rigid plate mechanically coupled to the flexible plate, the rigid plate comprising openings configured to permit passage of the pressure wave and a ring-shaped mechanical stress distributor; and a stoppage member affixed to the rigid plate and extending perpendicular relative to a surface of the rigid plate opposite the surface of the flexible plate, wherein the stoppage member is configured to limit motion of the flexible plate in response to the pressure wave including a threshold amplitude.

7. The microelectromechanical microphone device of claim 6, wherein the stress distributor comprises nitride.

8. The microelectromechanical microphone device of claim 6, wherein the rigid plate comprises a reverse bending edge comprising a first lateral etch stop comprising a first corner radius and a second lateral etch stop comprising a second corner radius different than the first corner radius.

9. The microelectromechanical microphone device of claim 8, wherein the first corner radius is more than wo nanometers, and wherein the second corner radius is more than 25 nanometers.

10. The microelectromechanical microphone device of claim 8, wherein a lateral step width between the first corner radius and the second corner radius is less than around 4 micrometers.

11. The microelectromechanical microphone device of claim 6, wherein the stress distributor comprises oxide.

12. The microelectromechanical microphone device of claim 6, wherein the stress distributor comprises a material layer.

13. A microelectromechanical microphone device comprising:

a flexible plate that is deformable by a pressure wave;

a rigid plate mechanically coupled to the flexible plate, the rigid plate comprising openings configured to permit passage of the pressure wave and a stress distributor; and a stoppage member affixed to the rigid plate and extending perpendicular relative to a surface of the rigid plate opposite the surface of the flexible plate, wherein the stoppage member is configured to limit motion of the flexible plate in response to the pressure wave including a threshold amplitude, wherein the rigid plate comprises a reverse bending edge comprising a first lateral etch stop comprising a first corner radius and a second lateral etch stop comprising a second corner radius different than the first corner radius.

14. The microelectromechanical microphone device of claim 13, wherein the first corner radius is more than 100 nanometers, and wherein the second corner radius is more than 25 nanometers.

15. The microelectromechanical microphone device of claim 13, wherein a lateral step width between the first corner radius and the second corner radius is less than around 4 micrometers.

16. The microelectromechanical microphone device of claim 13, wherein the stress distributor comprises nitride.

17. The microelectromechanical microphone device of claim 13, wherein the stress distributor comprises oxide.

18. The microelectromechanical microphone device of claim 13, wherein the stress distributor comprises a material layer.

* * * * *

UNITED STATES PATENT AND TRADEMARK OFFICE
CERTIFICATE OF CORRECTION

| | | |
|---|---|---|
| PATENT NO. | : 11,746,001 B2 | Page 1 of 1 |
| APPLICATION NO. | : 17/308340 | |
| DATED | : September 5, 2023 | |
| INVENTOR(S) | : Rombach et al. | |

It is certified that error appears in the above-identified patent and that said Letters Patent is hereby corrected as shown below:

In the Claims

In Column 12, in Claim 9, Line 2, delete "wo" and insert -- 100 --.

Signed and Sealed this
Twenty-eighth Day of November, 2023

Katherine Kelly Vidal
*Director of the United States Patent and Trademark Office*